United States Patent
Tsuchimura et al.

(10) Patent No.: US 8,778,593 B2
(45) Date of Patent: Jul. 15, 2014

(54) CHEMICAL AMPLIFICATION RESIST COMPOSITION, AND RESIST FILM, RESIST-COATED MASK BLANK, RESIST PATTERN FORMING METHOD AND PHOTOMASK EACH USING THE COMPOSITION

(75) Inventors: Tomotaka Tsuchimura, Shizouka (JP); Tadateru Yatsuo, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/538,216

(22) Filed: Jun. 29, 2012

(65) Prior Publication Data

US 2013/0029254 A1    Jan. 31, 2013

(30) Foreign Application Priority Data

Jul. 26, 2011   (JP) .................. 2011-163680

(51) Int. Cl.
- *G03F 7/038* (2006.01)
- *G03F 7/20* (2006.01)
- *G03F 7/30* (2006.01)
- *G03F 1/00* (2012.01)

(52) U.S. Cl.
USPC .............. 430/270.1; 430/271.1; 430/272.1; 430/275.1; 430/311; 430/325; 430/905; 430/942; 430/5; 430/9

(58) Field of Classification Search
None
See application file for complete search history.

(56) References Cited

U.S. PATENT DOCUMENTS

| | | |
|---|---|---|
| 2006/0154174 A1 | 7/2006 | Hada et al. |
| 2006/0166133 A1 | 7/2006 | Koitabashi et al. |
| 2008/0090179 A1 | 4/2008 | Takeda et al. |
| 2008/0241752 A1* | 10/2008 | Mizutani et al. ........... 430/286.1 |
| 2012/0115084 A1 | 5/2012 | Okuyama et al. |

FOREIGN PATENT DOCUMENTS

| | | | |
|---|---|---|---|
| JP | 2962145 B2 | | 8/1999 |
| JP | 2004-4249 | * | 1/2004 |
| JP | 2004-004249 A | | 1/2004 |
| JP | 2005-31233 A | | 2/2005 |
| JP | 2006-506480 A | | 2/2006 |
| JP | 2006-201532 A | | 8/2006 |
| JP | 2008-95009 A | | 4/2008 |
| JP | 2008-162101 A | | 7/2008 |
| JP | 2009-086354 A | | 4/2009 |
| JP | 2010-107963 A | | 5/2010 |
| JP | 2012-053291 A | | 3/2012 |

OTHER PUBLICATIONS

Derwent English abstract for JP 2004-4249 (2004).*
Machine-assisted English translation for JP 2004-4249 (2004), as provided by JPO.*
Office Action dated Apr. 23, 2013 in Japanese Patent Application No. 2011-163680.
Office Action dated Mar. 10, 2014 in Korean Patent Application No. 10-2012-0070571.

* cited by examiner

*Primary Examiner* — Sin J. Lee
(74) *Attorney, Agent, or Firm* — Sughrue Mion, PLLC

(57) ABSTRACT

A chemical amplification resist composition contains: (A) a polymer compound having a phenolic hydroxyl group and a group formed by substituting a substituent for a hydrogen atom of a hydroxyl group in a phenolic hydroxyl group and satisfying the following (a) to (c) at the same time: (a) the polydispersity is 1.2 or less, (b) the weight average molecular weight is from 2,000 to 6,500, and (c) the glass transition temperature (Tg) is 140° C. or more.

15 Claims, No Drawings

CHEMICAL AMPLIFICATION RESIST COMPOSITION, AND RESIST FILM, RESIST-COATED MASK BLANK, RESIST PATTERN FORMING METHOD AND PHOTOMASK EACH USING THE COMPOSITION

BACKGROUND OF THE INVENTION

1. Field of the Invention

The present invention relates to a chemical amplification resist composition suitably usable in the ultramicrolithography process such as production of VLSI or high-capacity microchip as well as in other photofabrication processes and capable of forming a highly defined pattern by using an electron beam or an extreme-ultraviolet ray, and a pattern forming method using the composition. More specifically, the present invention relates to a chemical amplification resist composition for use particularly in the process using a substrate having a specific underlying film, and a resist film, a resist-coated mask blank, a resist pattern forming method and a photomask each using the composition.

2. Description of the Related Art

In the microfabrication using a resist composition, with an increase in the integration degree of an integrated circuit, formation of an ultrafine pattern is required. To meet this requirement, the exposure wavelength tends to become shorter, such as from g-line to i-line or further to excimer laser light, and, for example, development of a lithography technique using an electron beam is proceeding at present.

As to the polymer compound or low molecular compound used for exposure to excimer laser light or electron beam, there are known various polymer compounds or low molecular compounds such as a narrow dispersive hydroxystyrene-based polymer (see, Japanese Patent No. 2,962,145), a hydroxystyrene-based polymer having a repeating unit corresponding to indene (see, JP-A-2006-201532 (the term "JP-A" as used herein means an "unexamined published Japanese patent application")), a low molecular compound having two or more phenolic hydroxyl groups per molecule (see, JP-A-2010-107963), and a (meth)acrylic polymer having a glass transition temperature of 120 to 170° C. (see, JP-A-2005-31233).

In order to form an ultrafine pattern, thin film formation of the resist is necessary, but thinning of the resist film incurs deterioration of the dry etching resistance. Also, in electron beam lithography, the effect of electron scattering (forward scattering) in the resist film is recently reduced by increasing the accelerating voltage of the electron beam (EB). However, in this case, the electron energy trapping ratio of the resist film decreases, giving rise to reduction in the sensitivity, and the effect of scattering (back scattering) of electrons reflected on the resist substrate increases.

Particularly, in the case of patterning on a photomask blank used for semiconductor exposure, a light-shielding film containing a heavy atom is present below the resist, and the effect of back scattering attributable to the heavy atom is more prominent.

As one of the methods to solve these problems, use of a polymer compound having a polycyclic aromatic structure such as naphthalene is being studied (see, for example, JP-A-2008-95009 and JP-A-2009-86354).

However, with respect to the performance such as sensitivity and resolution, more improvements are demanded. The microfabrication using a resist composition is not only used directly to produce an integrated circuit but also applied, in recent year, to the fabrication or the like of a so-called imprint mold structure (see, for example, JP-A-2008-162101 and Nanoimprint no Kiso to Gijutsu Kaihatsu•Oyo Tenkai—Nanoimprint no Kiban Gijutsu to Saishin no Gijutsu Tenkai (Basics and Developments of Technology and Application of Nanoimprint—Fundamental Technology of Nanoimprint and Deployment of Leading-Edge Technology), Yoshihiko Hirai (compiler), Frontier Shuppan (issued June, 2006)). Therefore, it becomes an important task to satisfy high sensitivity, high resolution property (for example, high resolution, excellent pattern profile and small line edge roughness (LER)) and good dry etching resistance all at the same time, and this needs to be solved.

SUMMARY OF THE INVENTION

An object of the present invention is to provide a chemical amplification resist composition capable of forming a pattern satisfying high sensitivity, high resolution property (for example, high resolution, excellent pattern profile and small line edge roughness (LER)) and good dry etching resistance all at the same time, and a resist film, a resist-coated mask blank, a resist pattern forming method and a photomask each using the composition.

That is, the present invention is as follows.

<1> A chemical amplification resist composition comprising:
(A) a polymer compound having a phenolic hydroxyl group and a group formed by substituting a substituent for a hydrogen atom of a hydroxyl group in a phenolic hydroxyl group and satisfying the following (a) to (c) at the same time:
(a) the polydispersity is 1.2 or less,
(b) the weight average molecular weight is from 2,000 to 6,500, and
(c) the glass transition temperature (Tg) is 140° C. or more.

<2> The chemical amplification resist composition as described in <1>, wherein the polymer compound (A) contain a repeating unit represented by the following formula (II) in an amount of 10 to 90 mol % based on all repeating units in the polymer compound (A):

wherein $R_2$ represents a hydrogen atom, a methyl group which may have a substituent, or a halogen atom, $Ar_2$ represents an aromatic ring group, and m represents an integer of 1 or more.

<3> The chemical amplification resist composition as described in <1> or <2>, further comprising:
(B) a compound capable of generating an acid upon irradiation with an actinic ray or radiation, and
(C) a compound capable of crosslinking the polymer compound (A) by the action of an acid.

<4> The chemical amplification resist composition as described in <3>, wherein the compound (C) is a compound having two or more hydroxymethyl groups or alkoxymethyl groups within the molecule.

<5> The chemical amplification resist composition as described in any one of <1> to <4>, wherein the polydispersity of the polymer compound (A) is 1.05 to 1.18.

<6> The chemical amplification resist composition as described in <1> to <5>, wherein the weight average molecular weight of the polymer compound (A) is from 2,500 to 5,000.
<7> The chemical amplification resist composition as described in <1 to <6> above, wherein the substituent in the group formed by substituting a substituent for a hydrogen atom of a hydroxyl group in a phenolic hydroxyl group of the polymer compound (A) is a group having a cyclic hydrocarbon structure.
<8> The chemical amplification resist composition as described in <7>, wherein the group having a cyclic hydrocarbon structure is a group having a polycyclic hydrocarbon structure.
<9> A resist film formed from the chemical amplification resist composition as described in any one of <1> to <8>.
<10> The resist film as described in <9>, having a thickness of 10 to 150 nm.
<11> A resist-coated mask blank coated with the resist film as described in <9> or <10>.
<12> A resist pattern forming method comprising:
 exposing the resist film as described in <9> or <10> and,
 developing the exposed film.
<13> A resist pattern forming method comprising:
 exposing the resist-coated mask blank as described in <11>, and
 developing the exposed mask blank.
<14> The resist pattern forming method as described in <12> or <13> above, wherein the exposing is performed using an electron beam or an extreme-ultraviolet ray.
<15> A photomask obtained by exposing and developing the resist-coated mask blank as described in <11>.

According to the present invention, a chemical amplification resist composition capable of forming a pattern satisfying high sensitivity, high resolution property (for example, high resolution, excellent pattern profile and small line edge roughness (LER)) and good dry etching resistance all at the same time, and a resist film, a resist-coated mask blank, a resist pattern forming method and a photomask each using the composition can be provided.

DETAILED DESCRIPTION OF THE INVENTION

The mode for carrying out the present invention is described in detail below.

Incidentally, in the description of the present invention, when a group (atomic group) is denoted without specifying whether substituted or unsubstituted, the group encompasses both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. In the description of the present invention, unless otherwise indicated, the "exposure" encompasses not only exposure to a mercury lamp, a far ultraviolet ray typified by excimer laser, an X-ray, EUV light or the like but also lithography with a particle beam such as electron beam and ion beam.

The chemical amplification resist composition of the present invention comprises (A) a polymer compound having a phenolic hydroxyl group and a group formed by substituting a substituent for a hydrogen atom of a hydroxyl group in a phenolic hydroxyl group and satisfying the following (a) to (c) at the same time. Each of the weight average molecular weight and polydispersity of the polymer compound (A) is defined as a value in terms of polystyrene by GPC measurement. The glass transition temperature of the polymer compound (A) is defined as measured value by thermal analysis (temperature rise rate: 2° C./min) using a differential scanning calorimeter.

(a) The polydispersity is 1.2 or less.
(b) The weight average molecular weight is from 2,000 to 6,500.
(c) The glass transition temperature (Tg) is 140° C. or more.

The chemical amplification resist composition according to the present invention is typically a chemical amplification negative resist composition.

The chemical amplification resist composition of the present invention is described in detail below.

[1] (A) Polymer Compound

The chemical amplification resist composition according to the present invention comprises (A) a polymer compound having a phenolic hydroxyl group and a group formed by substituting a substituent for a hydrogen atom of a hydroxyl group in a phenolic hydroxyl group and satisfying the above-described (a) to (c) at the same time.

The polymer compound (A) contains not only a phenolic hydroxyl group but also a group formed by substituting a substituent for a hydrogen atom of a hydroxyl group in a phenolic hydroxyl group, whereby both high sensitivity and high resolution can be achieved. The reason therefor is not clearly known, but it is considered that according to the resist film of the present invention using (A) a polymer compound having these groups, as compared with a conventional resist film using a polymer compound having a phenolic hydroxyl group but not having a group formed by substituting a substituent for a hydrogen atom of a hydroxyl group in a phenolic hydroxyl group, the dissolution rate of the exposed area for an alkali developer can be reduced (that is, the dissolution rate of a resist film using the polymer compound (A) can be controlled to an optimal dissolution rate) and in turn, the exposure dose necessary for irradiating the resist film of the present invention can be made smaller than in the case of using the above-described conventional film, which contributes to enhancement of the sensitivity. Also, as described above, the resist film of the present invention is less likely to be unintentionally excessively dissolved in an alkali developer as compared with the conventional resist film, and this is considered to contribute to enhancement of the resolution. These effects of the present invention are pronounced particularly when the resist film is a thin film (for example, when the thickness of the resist film is from 10 to 150 nm).

By virtue of the polymer compound (A) satisfying the above-described (a), high sensitivity can be achieved in pattern formation. This is considered because thanks to the low polydispersity, the amount of the low molecular weight component having a high dissolution rate for an alkali developer can be decreased in the polymer compound (A), as a result, the dissolution rate of the exposed area for an alkali developer can be reduced.

Also, it is considered that by virtue of the polymer compound (A) satisfying the above-described (b), that is, by virtue of having a weight average molecular weight of 2,000 or more, sufficient dry etching resistance is imparted and at the same time, by virtue of having a weight average molecular weight of 6,500 or less, the dissolution unit of the polymer compound (A) dissolved in a developer becomes small in the unexposed area and this contributes to enhancement of the resolution.

Furthermore, by virtue of the polymer compound (A) satisfying the above-described (c), the resolution can be enhanced. This is considered because when the glass transition temperature (Tg) of the polymer compound is high as in (c), the acid generated in the exposed area can hardly diffuse into the unexposed area. In addition, by virtue of the polymer compound (A) satisfying (c), the obtained resist film becomes very hard, as a result, the dry etching resistance is improved and at the same time, the obtained pattern is less likely to collapse, which is considered to also contribute to enhancement of the resolution.

With respect to (a) above, the polydispersity of the polymer compound (A) is preferably from 1.05 to 1.18, more preferably from 1.10 to 1.16.

With respect to (b) above, the weight average molecular weight of the polymer compound (A) is preferably 2,500 to 5,000, more preferably from 2,800 to 4,500.

With respect to (c) above, the glass transition temperature (Tg) of the polymer compound (A) is preferably 145° C. or more, more preferably 150° C. or more. The upper limit of the glass transition temperature is not particularly limited but is usually 250° C. or less, preferably 170° C. or less.

The phenolic hydroxyl group as used in the present invention is a group formed by substituting a hydroxyl group for a hydrogen atom of an aromatic ring group. The aromatic ring group is a monocyclic or polycyclic aromatic ring, and examples thereof include an aromatic hydrocarbon ring having a carbon number of 6 to 18, which may have a substituent, such as benzene ring, naphthalene ring, anthracene ring, fluorene ring and phenanthrene ring, and an aromatic heterocyclic ring containing a heterocyclic ring such as thiophene ring, furan ring, pyrrole ring, benzothiophene ring, benzofuran ring, benzopyrrole ring, triazine ring, imidazole ring, benzimidazole ring, triazole ring, thiadiazole ring and thiazole ring. Among these, a benzene ring and a naphthalene ring are preferred in view of resolution, and a benzene ring is most preferred.

The polymer compound (A) is not particularly limited in its structure and the like as long as the compound satisfies (a) to (c) above, but for satisfying (c), the substituent in the "group formed by substituting a hydrogen atom of a hydroxyl group in a phenolic hydroxyl group" contained in the polymer compound (A) is preferably a group having a cyclic hydrocarbon structure.

The total carbon number of the group having a cyclic hydrocarbon structure is preferably from 5 to 40, more preferably from 7 to 30.

The cyclic hydrocarbon structure in the group having a cyclic hydrocarbon structure may be monocyclic or polycyclic. The monocyclic hydrocarbon structure is preferably a cycloalkyl group having a carbon number of 3 to 8 or an aryl group having a carbon number of 6 to 8, and examples thereof include a cyclopropyl group, a cyclopentyl group, a cyclohexyl group, a cyclobutyl group, a cyclooctyl group, and a phenyl group. The polycyclic hydrocarbon structure includes, for example, a bicycle structure, a tricyclo structure or a tetracyclo structure each having a carbon number of 5 or more, and a polycyclic cyclo structure and a polycyclic aromatic structure each having a carbon number of 6 to 30 are preferred. Examples thereof include structures corresponding to an indene group, a fluorene group, an acenaphthene group, an adamantyl group, a decalin group, a norbornyl group, an isoboronyl group, a camphanyl group, a dicyclopentyl group, an α-pinel group, a tricyclodecanyl group, a tetracyclododecyl group, an androstanyl group, a naphthyl group, an anthracenyl group and a biphenyl group. Incidentally, a part of carbon atoms in the monocyclic or polycyclic hydrocarbon structure may be substituted with a heteroatom such as oxygen atom.

Among these polycyclic hydrocarbon structures, structures corresponding to an indene group, a fluorene group, an acenaphthene group, a naphthyl group, an adamantyl group, a decalin group, a norbornyl group, an isoboronyl group, a camphanyl group and a dicyclopentyl group are preferred, and a structure corresponding to an adamantyl group is most preferred in view of dry etching resistance.

The cyclic hydrocarbon structure may further have a substituent, and examples of the further substituent include an alkyl group, an aryl group, a halogen atom, a hydroxyl group, an alkoxy group, a carboxyl group, and an alkoxycarbonyl group.

The group having a cyclic hydrocarbon structure is more preferably a group having a polycyclic hydrocarbon structure, and the polycyclic hydrocarbon structure in the group having a polycyclic hydrocarbon structure means a structure having a plurality of monocyclic hydrocarbon groups, or a polycyclic hydrocarbon structure, and may be a crosslinked structure. Examples of the monocyclic hydrocarbon structure in the structure having a plurality of monocyclic hydrocarbon groups are the same as those of the monocyclic hydrocarbon structure described above.

The structure having a plurality of monocyclic hydrocarbon groups preferably has from 2 to 4 monocyclic hydrocarbon groups, more preferably 2 monocyclic hydrocarbon groups. Examples of the polycyclic hydrocarbon structure are the same as those described above.

Preferred examples of the polycyclic hydrocarbon structure are illustrated below, but the present invention is not limited thereto.

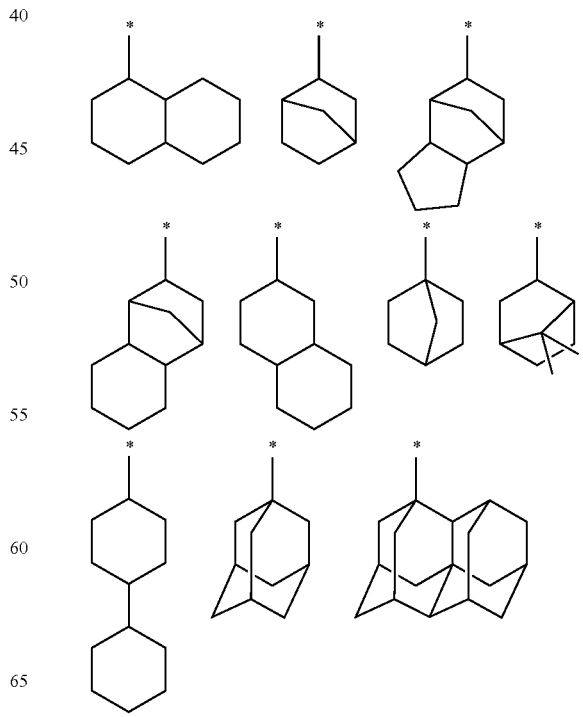

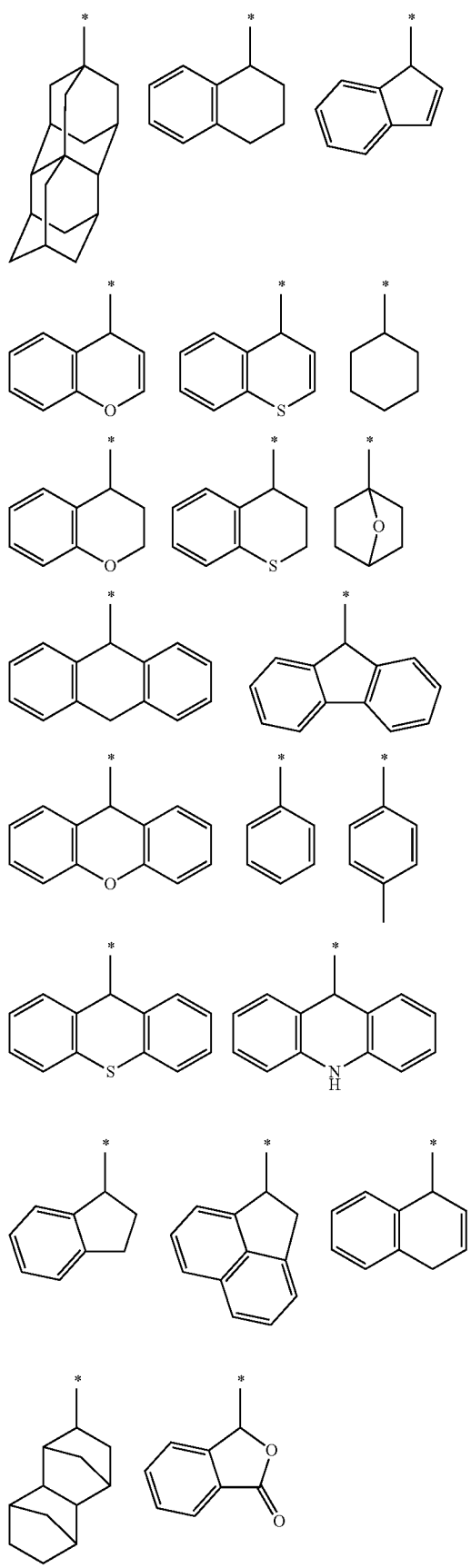
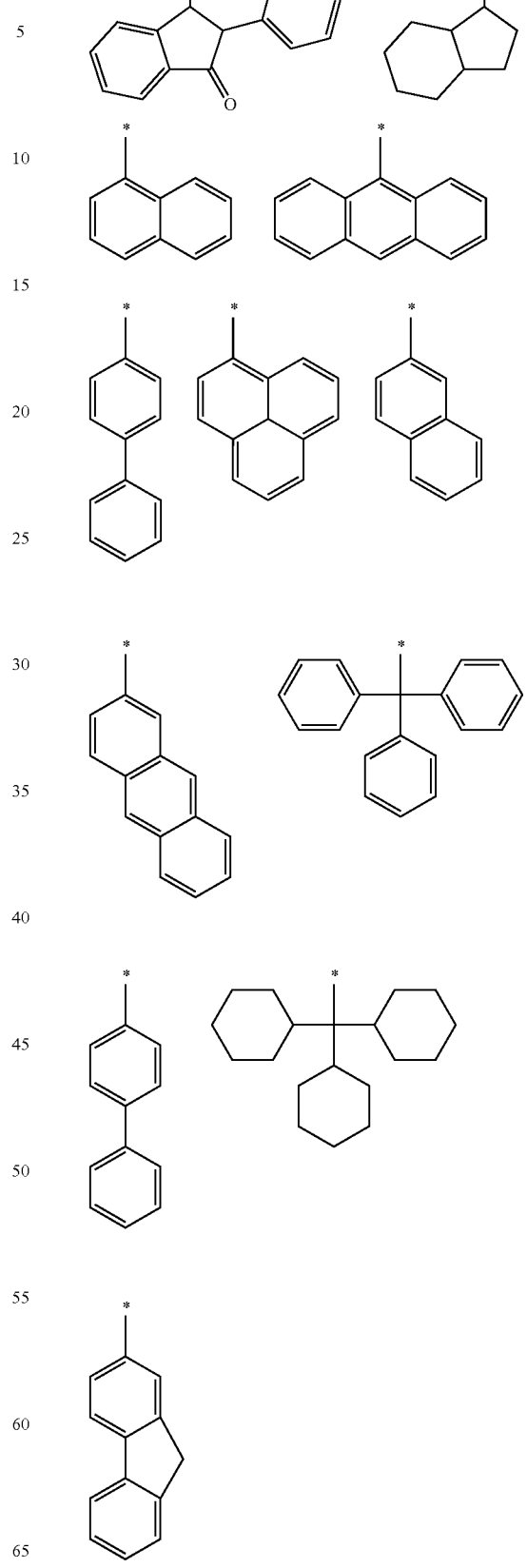

Among these specific examples of the polycyclic hydrocarbon structure, the followings are preferred.

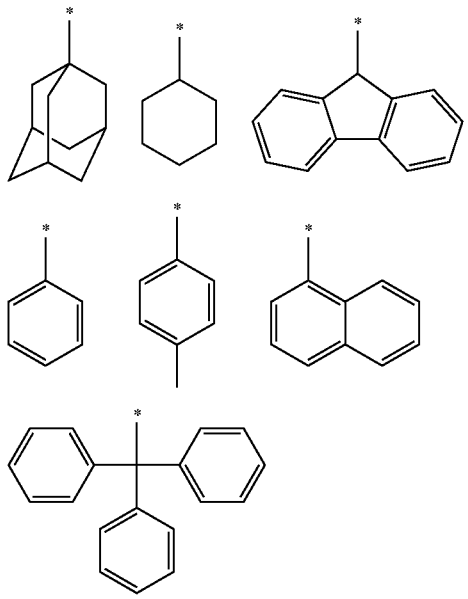

Among those specific examples of the polycyclic hydrocarbon structure, the followings are more preferred.

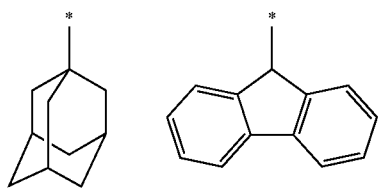

The group having a cyclic hydrocarbon structure is preferably a group represented by the following formula (a):

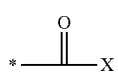
(a)

In formula (a), X represents a cyclic hydrocarbon structure and is preferably a polycyclic hydrocarbon structure.

Examples of the cyclic hydrocarbon structure (the polycyclic hydrocarbon structure as a preferred embodiment) of X are the same as those described above.

* is a bond connected to the oxygen atom of a hydroxyl group in "a group formed by substituting a substituent for a hydrogen atom of a hydroxyl group in a phenolic hydroxyl group".

The polymer compound (A) preferably contains a repeating unit having "a group formed by substituting a substituent for a hydrogen atom of a hydroxyl group in a phenolic hydroxyl group", and the repeating unit is preferably a repeating unit represented by the following formula (I):

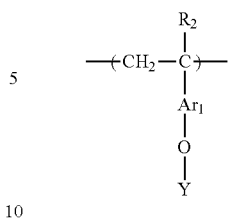
(I)

In formula (I), $R_1$ represents a hydrogen atom or a methyl group, $Ar_1$ represents an aromatic ring group, and Y represents a group having a cyclic hydrocarbon structure.

$R_1$ is preferably a hydrogen atom.

Specific examples and preferred examples of the aromatic ring in the aromatic ring group of $Ar_1$ are the same as those described above in connection with a phenolic hydroxyl group.

Specific examples and preferred examples of the group having a cyclic hydrocarbon structure of Y are the same as specific examples and preferred examples of the group having a cyclic hydrocarbon structure described above.

The content of the repeating unit represented by formula (I) is preferably from 1 to 50 mol %, more preferably from 5 to 30 mol %, still more preferably from 10 to 20 mol %, based on all repeating units in the polymer compound (A).

The polymer compound (A) preferably contains a repeating unit having a phenolic hydroxyl group, and the repeating unit is preferably a repeating unit represented by the following formula (II):

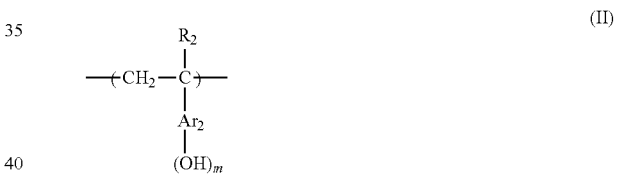
(II)

(wherein $R_2$ represents a hydrogen atom, a methyl group which may have a substituent, or a halogen atom, $Ar_2$ represents an aromatic ring, and m represents an integer of 1 or more).

Examples of the methyl group which may have a substituent in $R_2$ include a trifluoromethyl group and a hydroxymethyl group.

$R_2$ is preferably a hydrogen atom.

Specific examples and preferred examples of the aromatic ring in the aromatic ring group of $Ar_2$ are the same as those described above in connection with a phenolic hydroxyl group.

m is preferably an integer of 1 to 5 and most preferably 1. When m is 1 and Ar is a benzene ring, the substitution position of —OH may be a para-position, a meta-position or an ortho-position with respect to the bonding position of the benzene ring to the polymer main chain but is preferably a para-position, because it is easy to satisfy the requirement of (c).

The aromatic ring in the aromatic group of Ar may have a substitution other than the group represented by —OH, and examples of the substituent include an alkyl group, a halogen atom, a hydroxyl group, an alkoxy group, a carboxyl group, an alkoxycarbonyl group, an alkylcarbonyl group, an alkylcarbonyloxy group, an alkylsulfonyloxy group, and an arylcarbonyl group.

The content of the repeating unit represented by formula (II) is preferably from 10 to 90 mol %, more preferably from 30 to 90 mol %, still more preferably from 40 to 90 mol %, based on all repeating units in the polymer compound (A). Within this range, when the resist film is a thin film (for example, when the thickness of the resist film is from 10 to 150 nm), the dissolution rate of the unexposed area for an alkali developer can be more unfailingly reduced (that is, the dissolution rate of the resist film using the polymer compound (A) can be more unfailingly controlled to be an optimal dissolution rate) in the resist film of the present invention formed using the polymer compound (A). As a result, the sensitivity can be more reliably enhanced.

Examples of the repeating unit represented by formula (II) are illustrated below, but the present invention is not limited thereto.

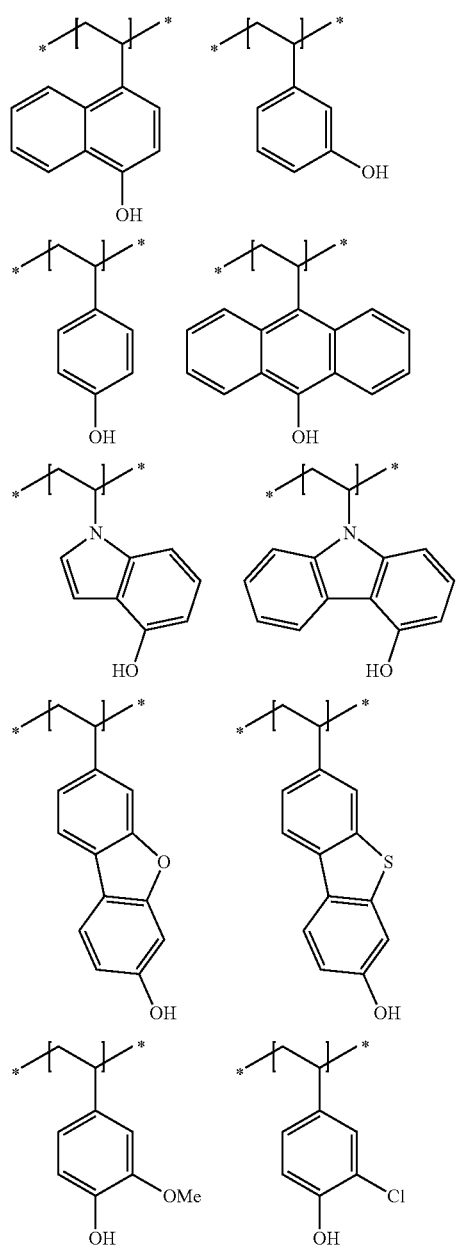

-continued

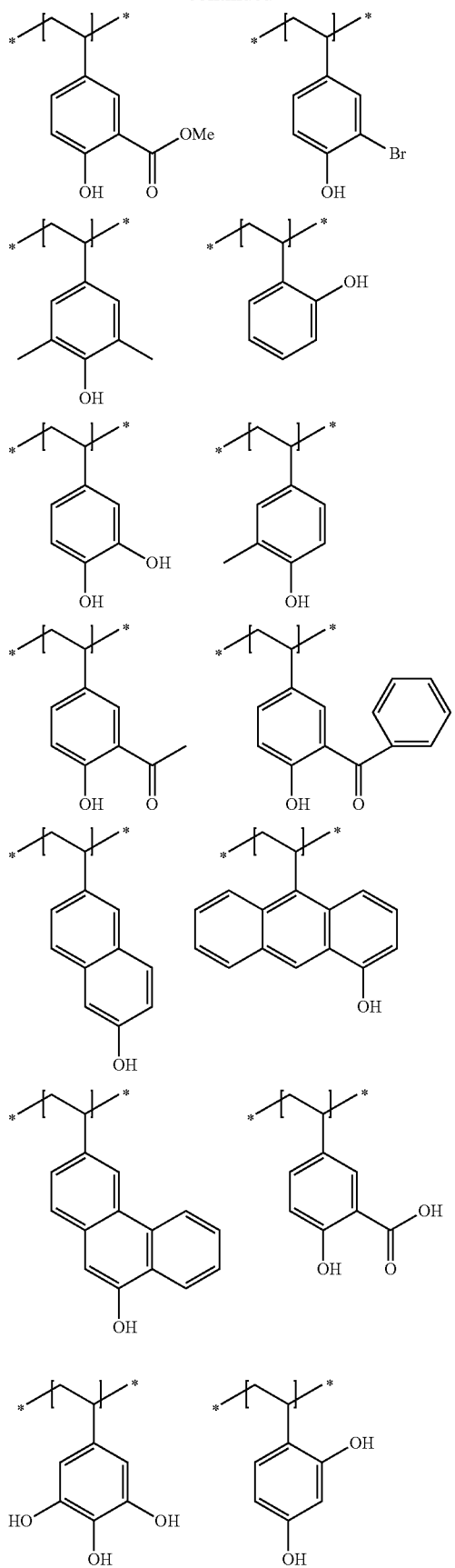

-continued

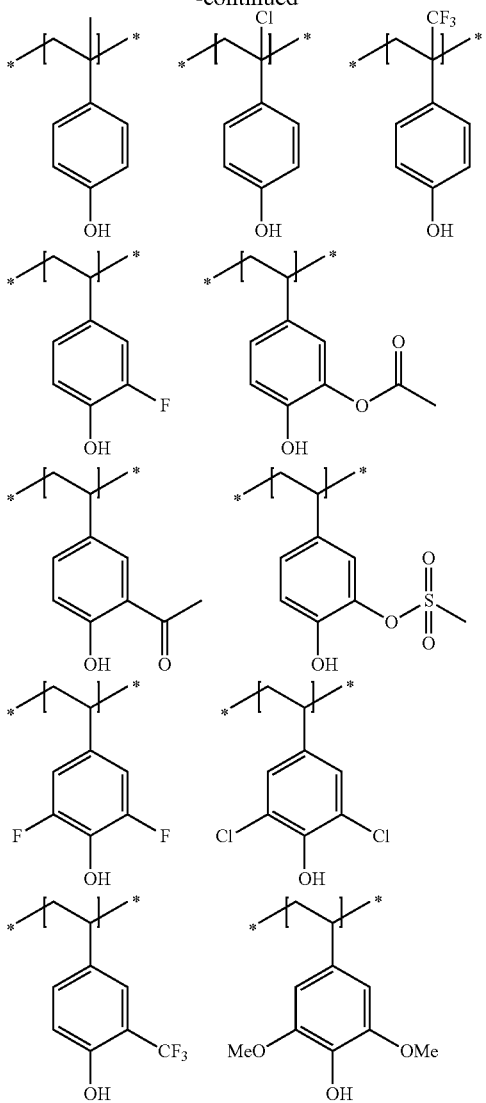

It is also preferred that the polymer compound (A) further contains the following repeating units (hereinafter, sometimes referred to as "other repeating units") as a repeating unit other than the above-described repeating units.

Examples of the polymerizable monomer for forming these other repeating units include styrene, an alkyl-substituted styrene, an alkoxy-substituted styrene, an O-alkylated styrene, an O-acylated styrene, a hydrogenated hydroxystyrene, a maleic anhydride, an acrylic acid derivative (such as acrylic acid and acrylic acid ester), a methacrylic acid derivative (such as methacrylic acid and methacrylic acid ester), an N-substituted maleimide, an acrylonitrile, a methacrylonitrile, a vinylnaphthalene, a vinylanthracene, and an indene which may have a substituent.

The polymer compound (A) may or may not contain these other repeating units but in the case of containing other repeating units, the content thereof in the polymer compound (A) is generally from 1 to 20 mol %, preferably from 2 to 10 mol %, based on all repeating units constituting the polymer compound (A).

It is also preferred to further contain a repeating unit having a group capable of decomposing by the action of an alkali developer to increase the dissolution rate in the alkali developer, or a repeating unit having a photoacid generating group, as a repeating unit other than the above-described repeating units.

The repeating unit having a group capable of decomposing by the action of an alkali developer to increase the dissolution rate in an alkali developer includes, for example, a repeating unit having a lactone structure or a phenyl ester structure and is preferably a repeating unit having a 5- to 7-membered ring lactone structure, more preferably a 5- to 7-membered ring lactone structure to which another ring structure is fused in the form of forming a bicyclo structure or a spiro structure. Specific examples of the repeating unit having a group capable of decomposing by the action of an alkali developer to increase the dissolution rate in the alkali developer are illustrated below. In the formulae, Rx represents H, $CH_3$, $CH_2OH$ or $CF_3$.

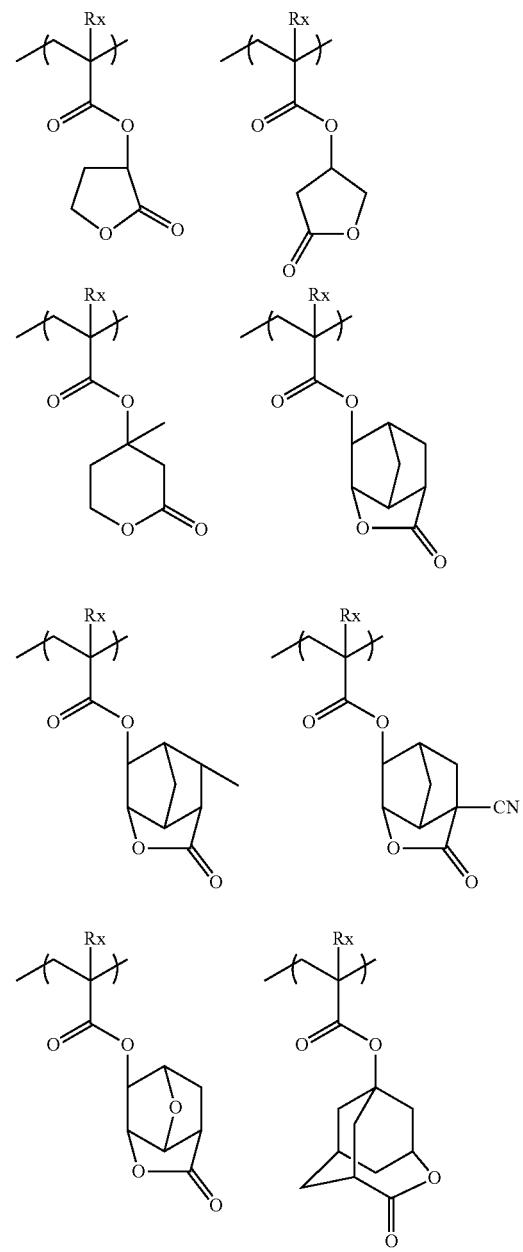

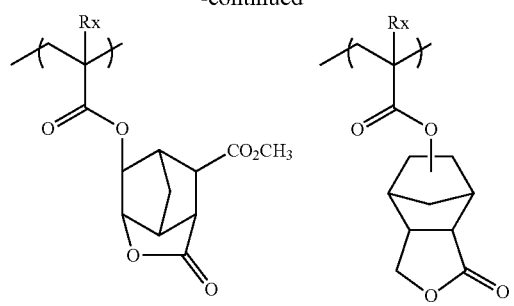
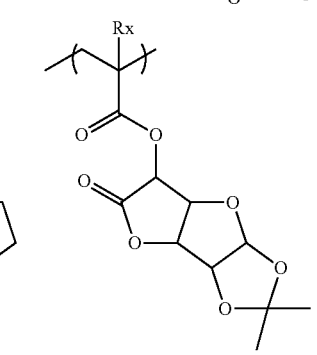
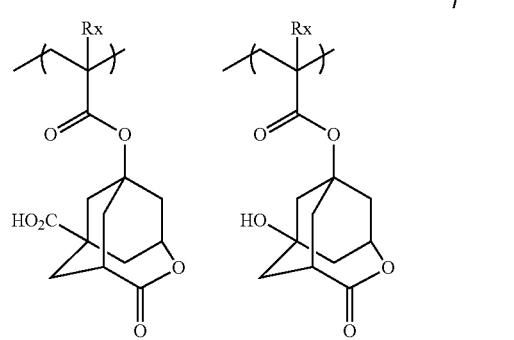
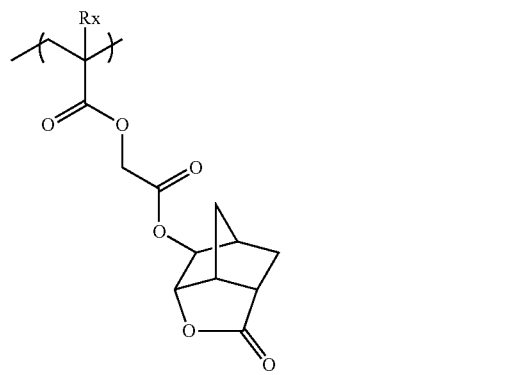
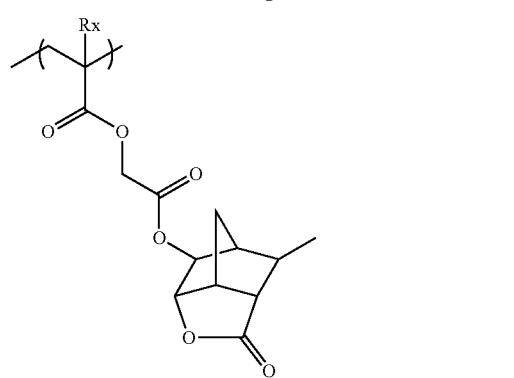
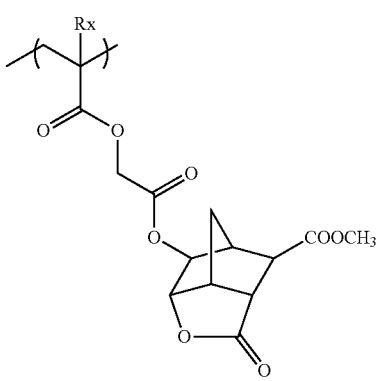
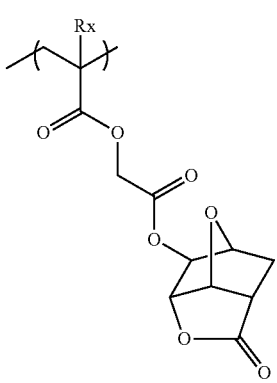
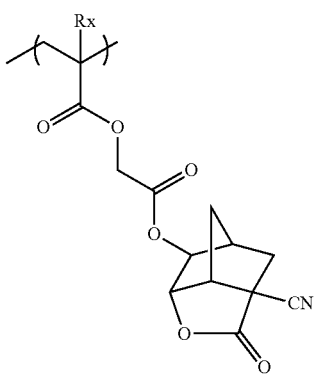
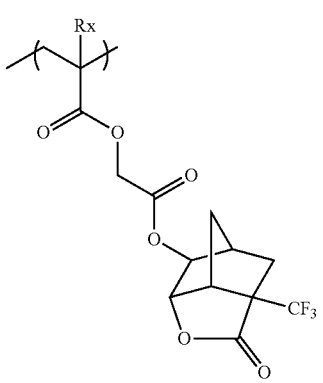

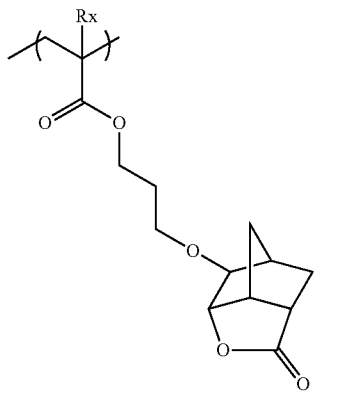
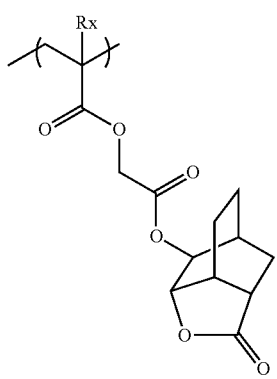
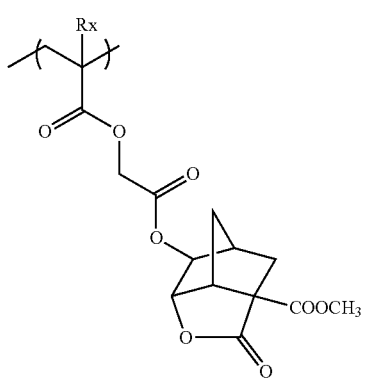
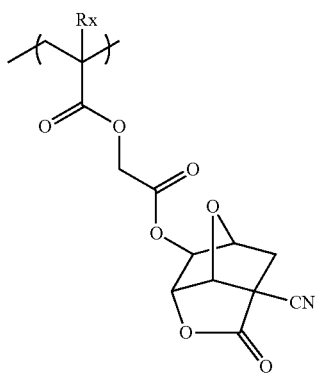

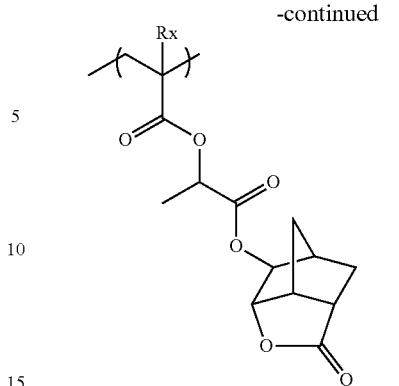
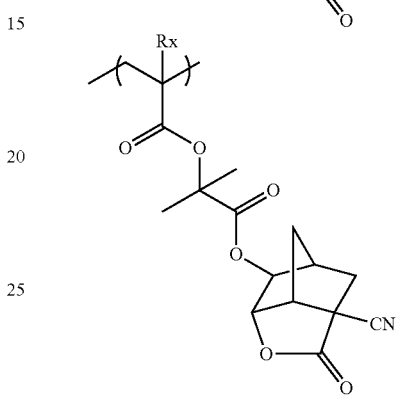
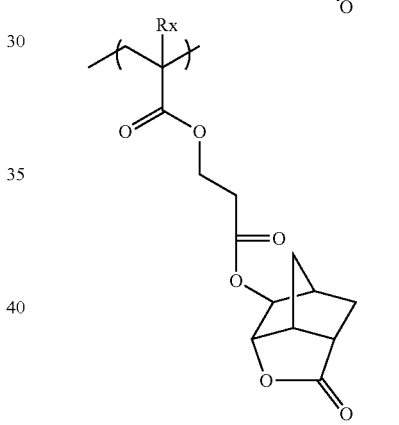
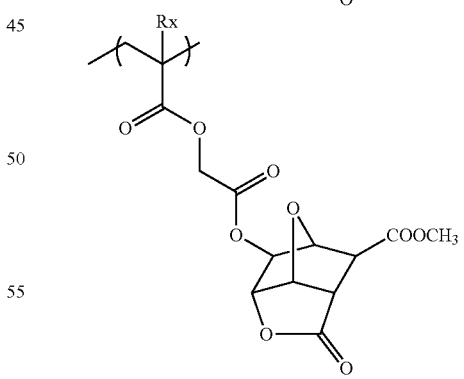

The polymer compound (A) may or may not contain a repeating unit having a group capable of decomposing by the action of an alkali developer to increase the dissolution rate in the alkali developer, but in the case of containing a repeating unit having a group capable of decomposing by the action of an alkali developer to increase the dissolution rate in the alkali developer, the content thereof is preferably from 5 to 50 mol %, more preferably from 10 to 40 mol %, still more preferably from 15 to 30 mol %, based on all repeating units in the polymer compound (A).

In the present invention, a repeating unit having a photoacid generating group is preferably further contained as a repeating unit other than the above-described repeating units, and examples of such a repeating unit include the repeating units described in paragraph [0028] of JP-A-9-325497 and the repeating units described in paragraphs [0038] to [0041] of JP-A-2009-93137. In this case, the repeating unit having a photoacid generating group can be considered to come under the (B) compound capable of generating an acid upon irradiation with an actinic ray or radiation.

Specific examples of the monomer corresponding to the repeating unit having a photoacid generating group (shown as the structure of the acid generated upon EB or EUV exposure) are illustrated below.

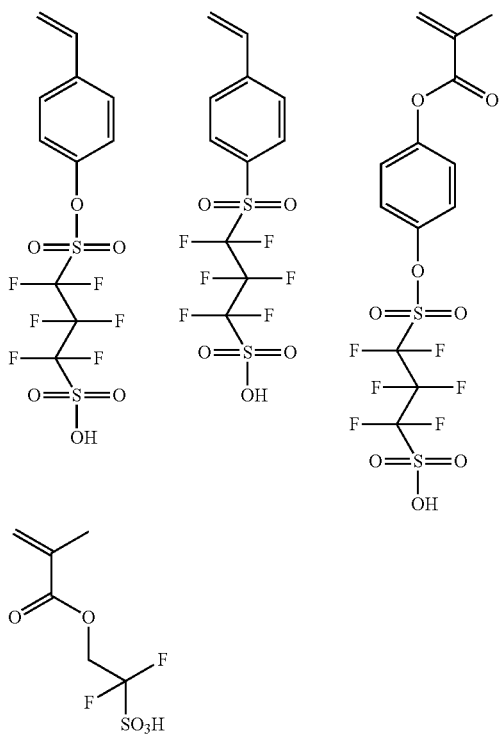

In the case where the polymer compound (A) contains a repeating unit having a photoacid generating group, the content of the repeating unit having a photoacid generating compound is preferably from 1 to 40 mol %, more preferably from 5 to 35 mol %, still more preferably from 5 to 30 mol %, based on all repeating units in the polymer compound (A).

The polymer compound (A) is preferably obtained by using living polymerization such as living radical polymerization method (e.g., iniferter method) and living anionic polymerization method, and in this case, the polydispersity can be easily made to be 1.2 or less. For example, in the living anionic polymerization method, vinyl monomers are dissolved in an appropriate organic solvent and reacted usually under cooling condition by using a metal compound (e.g., butyllithium) as the initiator, whereby the polymer can be obtained.

As the polymer compound (A), a polyphenol compound produced by a condensation reaction of an aromatic ketone or aromatic aldehyde and a compound containing from 1 to 3 phenolic hydroxyl groups (see, for example, JP-A-2008-145539), a calixarene derivative (see, for example, JP-A-2004-18421), a Noria derivative (see, for example, JP-A-2009-222920), and a polyphenol derivative (see, for example, JP-A-2008-94782) can be also applied, and such a compound may be modified by a polymer reaction to synthesize the polymer compound.

The polymer compound (A) is preferably synthesized through a polymer reaction to modify a polymer synthesized by living radical polymerization or living anionic polymerization or a commercially available polymer having a polydispersity of 1.2 or less.

The amount of the polymer compound (A) added in the chemical amplification resist composition of the present invention is preferably from 30 to 95 mass %, more preferably from 40 to 90 mass %, still more preferably from 50 to 85 mass %, based on the entire solid content of the composition.

Specific examples of the polymer compound (A) for use in the present invention are illustrated below, but the present invention is not limited thereto.

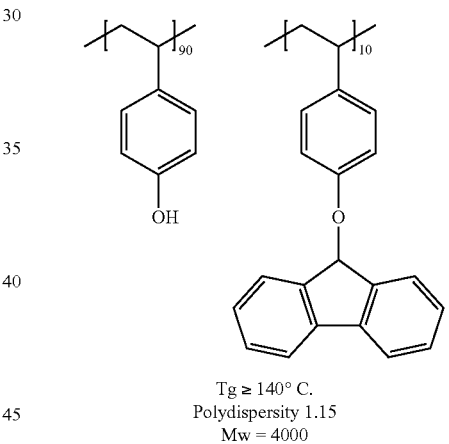

Tg ≥ 140° C.
Polydispersity 1.15
Mw = 4000

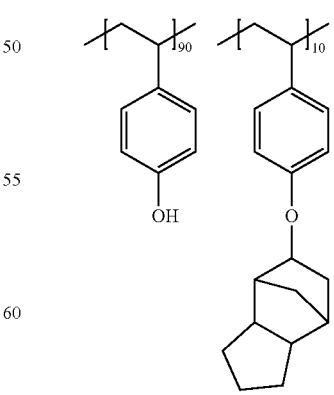

Tg ≥ 140° C.
Polydispersity 1.14
Mw = 3200

-continued
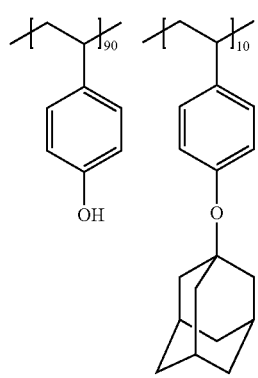
Tg ≥ 140° C.
Polydispersity 1.15
Mw = 3500
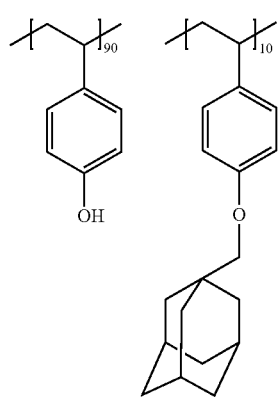
Tg ≥ 140° C.
Polydispersity 1.15
Mw = 3500
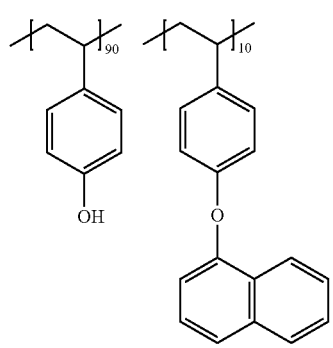
Tg ≥ 140° C.
Polydispersity 1.15
Mw = 3500
-continued
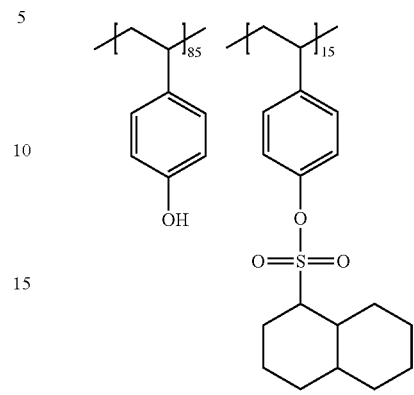
Tg ≥ 140° C.
Polydispersity 1.15
Mw = 4000
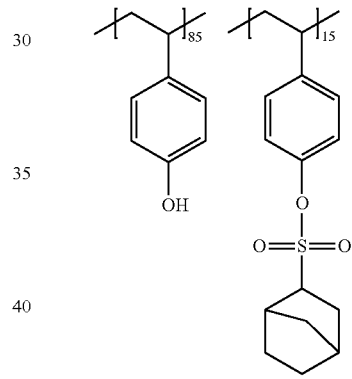
Tg ≥ 140° C.
Polydispersity 1.15
Mw = 3500
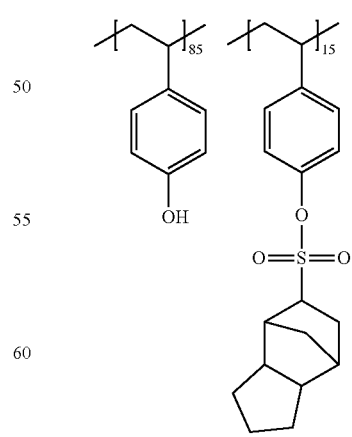
Tg ≥ 140° C.
Polydispersity 1.14
Mw = 3200

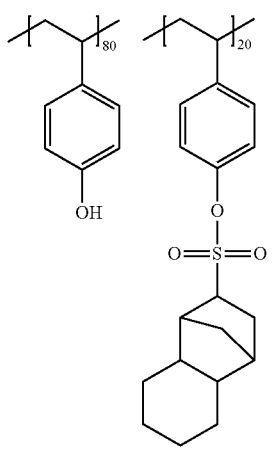
Tg ≥ 140° C.
Polydispersity 1.13
Mw = 3200
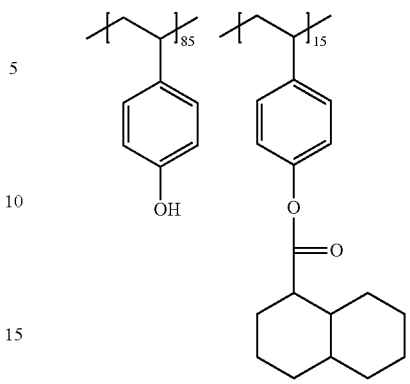
Tg ≥ 140° C.
Polydispersity 1.15
Mw = 4000
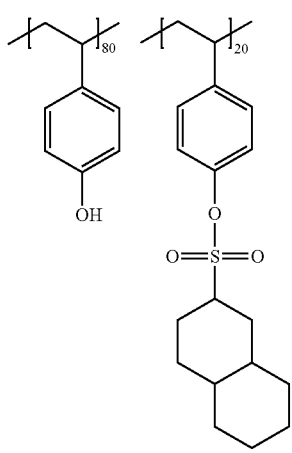
Tg ≥ 140° C.
Polydispersity 1.15
Mw = 3500
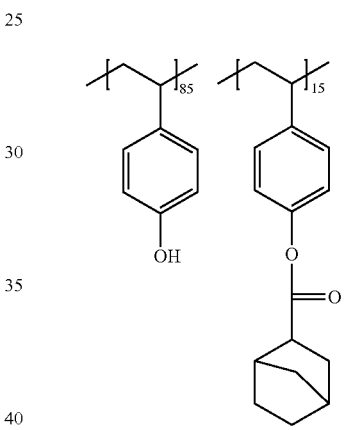
Tg ≥ 140° C.
Polydispersity 1.15
Mw = 3500
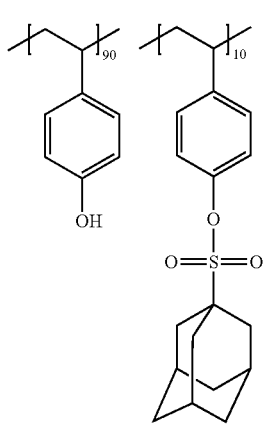
Tg ≥ 140° C.
Polydispersity 1.15
Mw = 3500
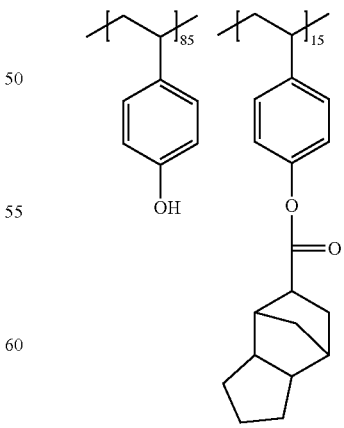
Tg ≥ 140° C.
Polydispersity 1.14
Mw = 3200

25
-continued
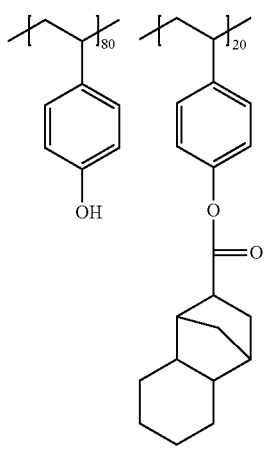
Tg ≥ 140° C.
Polydispersity 1.13
Mw = 3200
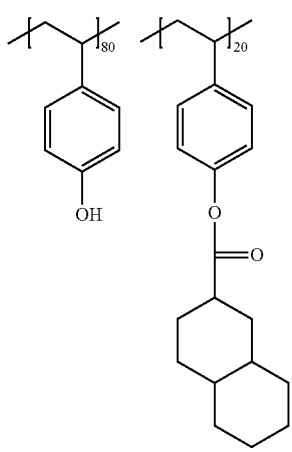
Tg ≥ 140° C.
Polydispersity 1.15
Mw = 3500
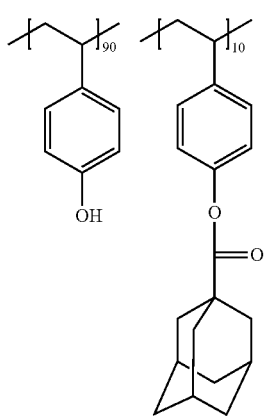
Tg ≥ 140° C.
Polydispersity 1.15
Mw = 3500
26
-continued
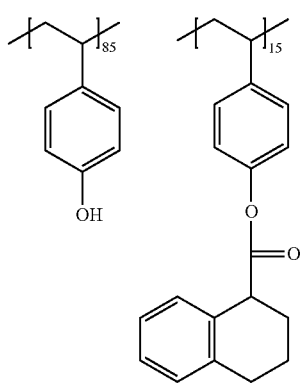
Tg ≥ 140° C.
Polydispersity 1.15
Mw = 4000
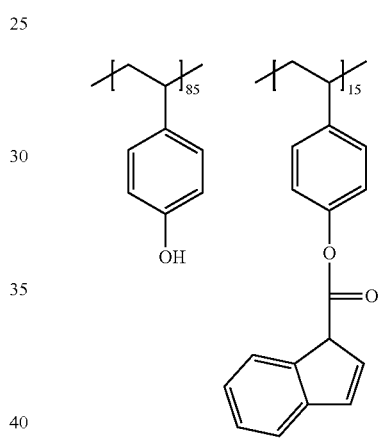
Tg ≥ 140° C.
Polydispersity 1.15
Mw = 3500
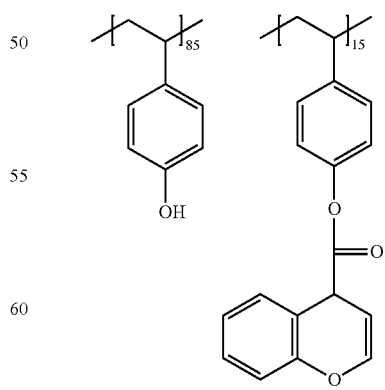
Tg ≥ 140° C.
Polydispersity 1.14
Mw = 3200

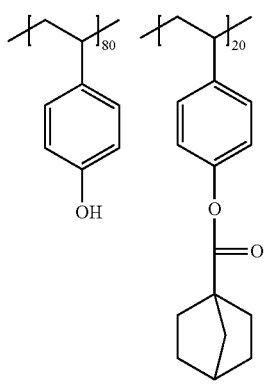
Tg ≥ 140° C.
Polydispersity 1.13
Mw = 3200
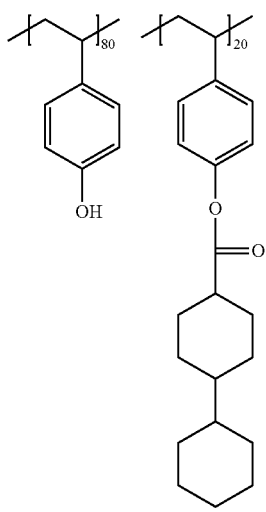
Tg ≥ 140° C.
Polydispersity 1.15
Mw = 3600
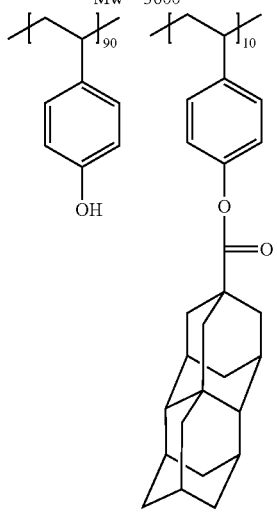
Tg ≥ 140° C.
Polydispersity 1.15
Mw = 3800
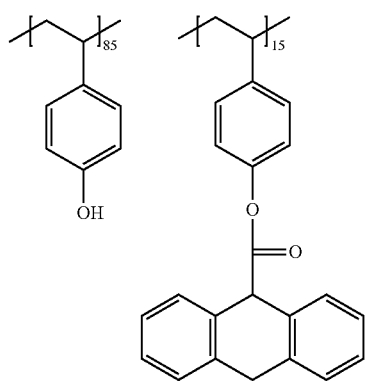
Tg ≥ 140° C.
Polydispersity 1.15
Mw = 4000
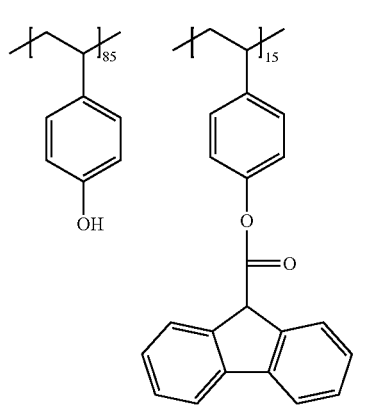
Tg ≥ 140° C.
Polydispersity 1.15
Mw = 3500
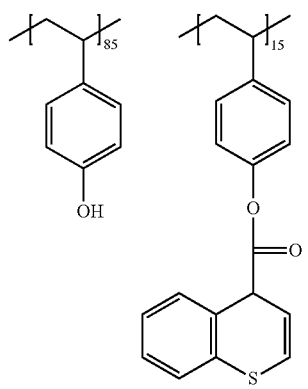
Tg ≥ 140° C.
Polydispersity 1.14
Mw = 3200

-continued
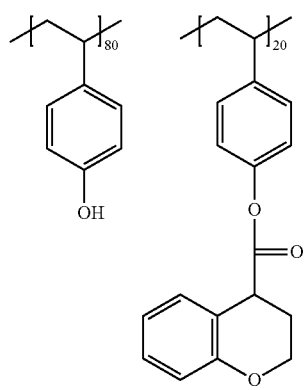
Tg ≥ 140° C.
Polydispersity 1.13
Mw = 3200
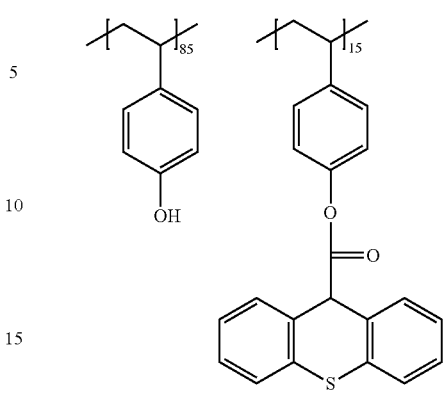
Tg ≥ 140° C.
Polydispersity 1.15
Mw = 4000
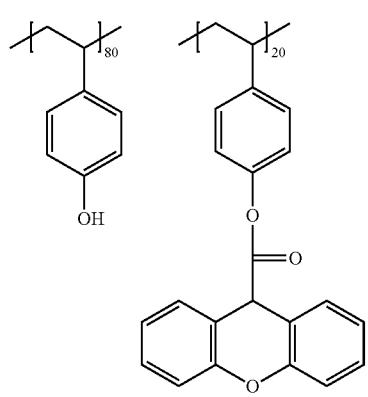
Tg ≥ 140° C.
Polydispersity 1.15
Mw = 3600
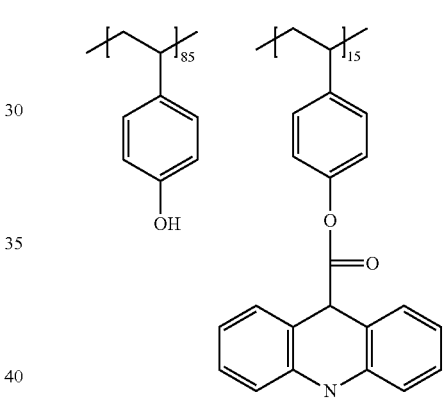
Tg ≥ 140° C.
Polydispersity 1.15
Mw = 3500
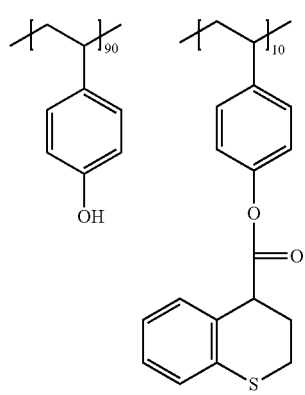
Tg ≥ 140° C.
Polydispersity 1.15
Mw = 3800
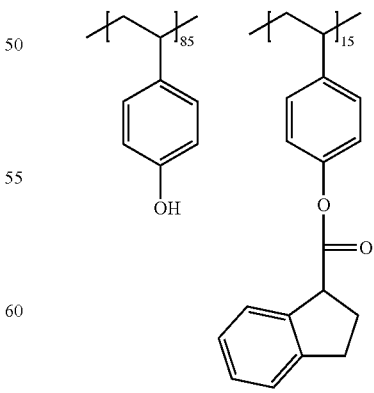
Tg ≥ 140° C.
Polydispersity 1.14
Mw = 4200

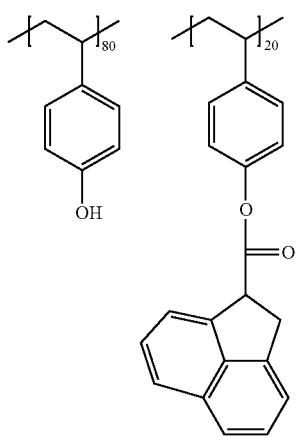
Tg ≥ 140° C.
Polydispersity 1.18
Mw = 4200
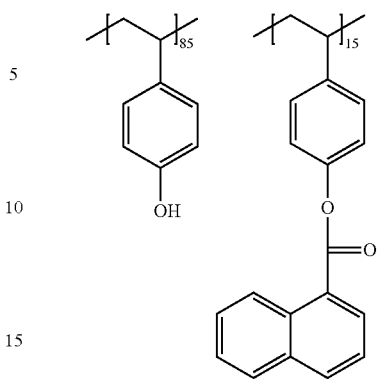
Tg ≥ 140° C.
Polydispersity 1.15
Mw = 4000
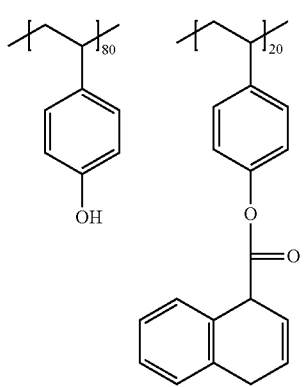
Tg ≥ 140° C.
Polydispersity 1.15
Mw = 4000
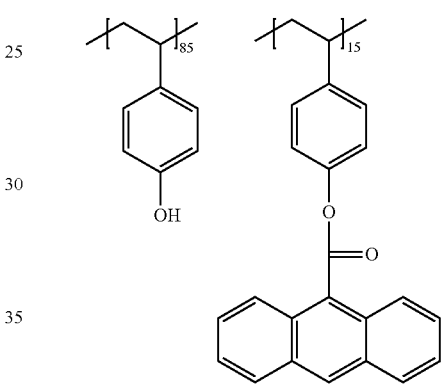
Tg ≥ 140° C.
Polydispersity 1.15
Mw = 3500
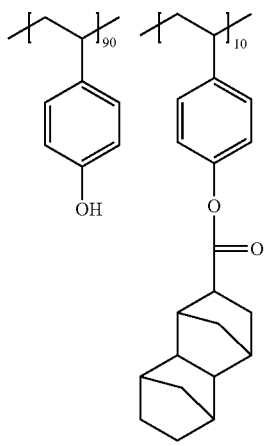
Tg ≥ 140° C.
Polydispersity 1.15
Mw = 4200
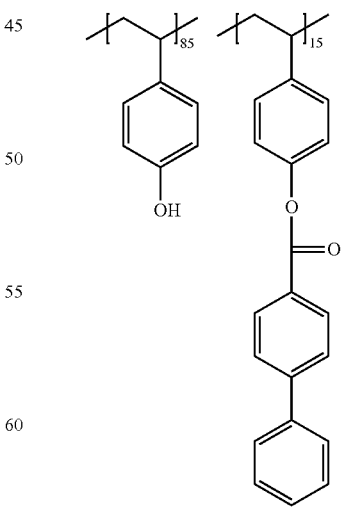
Tg ≥ 140° C.
Polydispersity 1.14
Mw = 4200

-continued
33
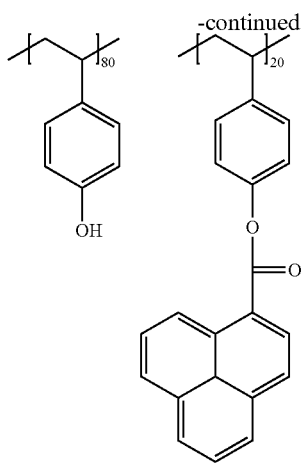
Tg ≥ 140° C.
Polydispersity 1.18
Mw = 4200
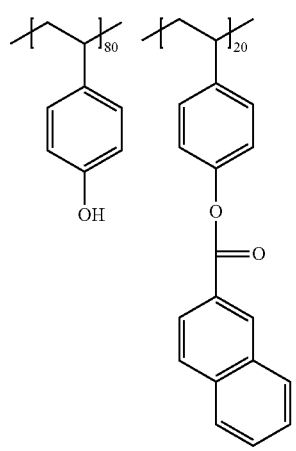
Tg ≥ 140° C.
Polydispersity 1.15
Mw = 4000
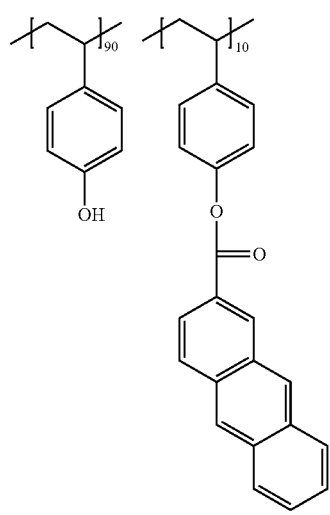
Tg ≥ 140° C.
Polydispersity 1.15
Mw = 4200
-continued
34
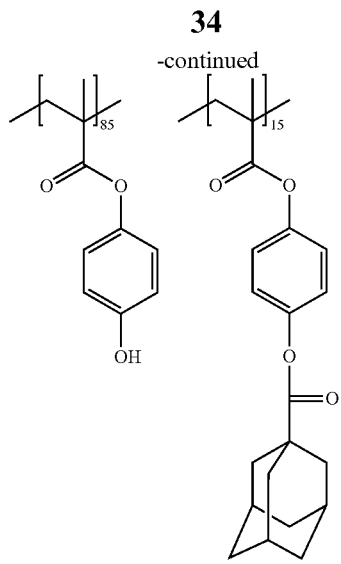
Tg ≥ 140° C.
Polydispersity 1.15
Mw = 3500
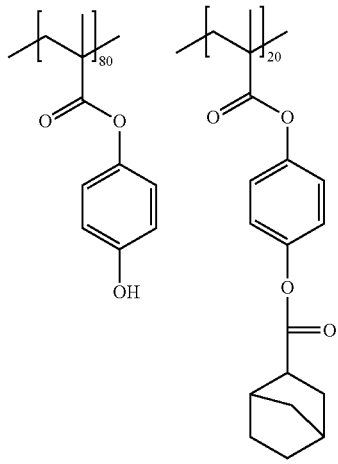
Tg ≥ 140° C.
Polydispersity 1.15
Mw = 3500
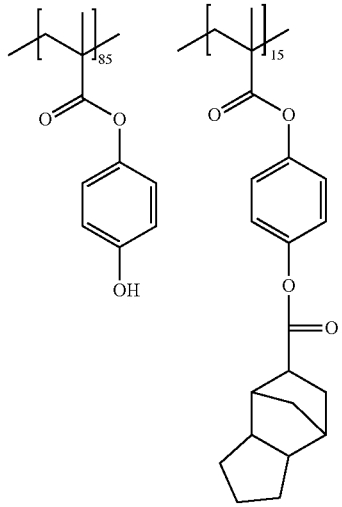
Tg ≥ 140° C.
Polydispersity 1.15
Mw = 3500

-continued
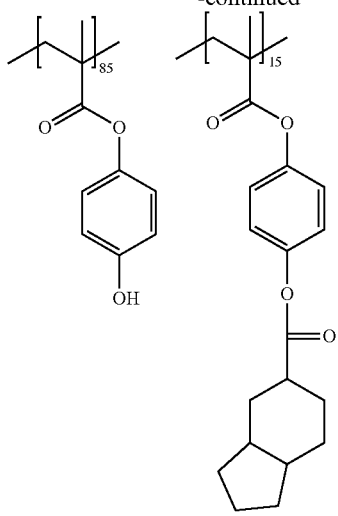
Tg ≥ 140° C.
Polydispersity 1.15
Mw = 3500
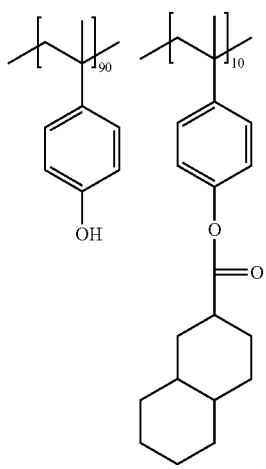
Tg ≥ 140° C.
Polydispersity 1.15
Mw = 3500
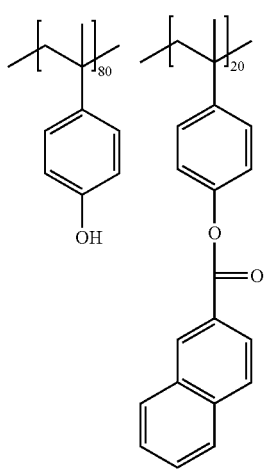
Tg ≥ 140° C.
Polydispersity 1.15
Mw = 3500
-continued
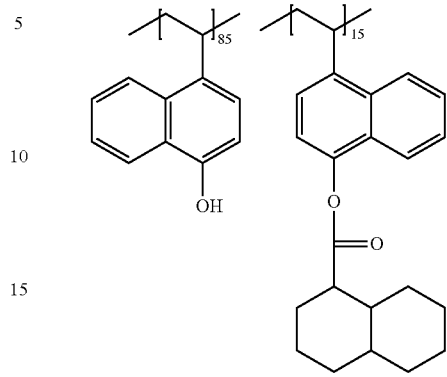
Tg ≥ 140° C.
Polydispersity 1.15
Mw = 4000
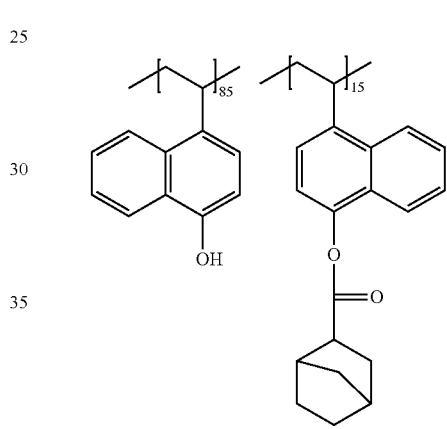
Tg ≥ 140° C.
Polydispersity 1.15
Mw = 3500
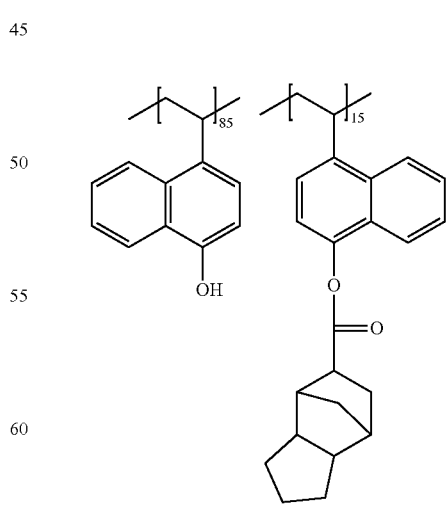
Tg ≥ 140° C.
Polydispersity 1.15
Mw = 3200

-continued
37
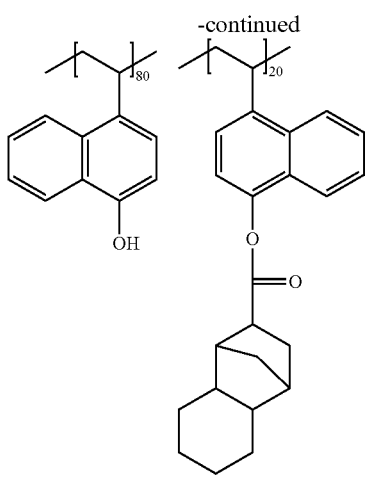
Tg ≥ 140° C.
Polydispersity 1.13
Mw = 3200
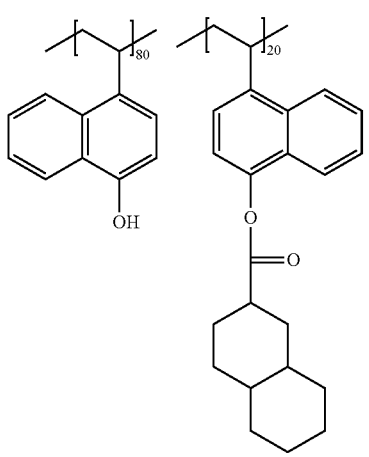
Tg ≥ 140° C.
Polydispersity 1.15
Mw = 3500
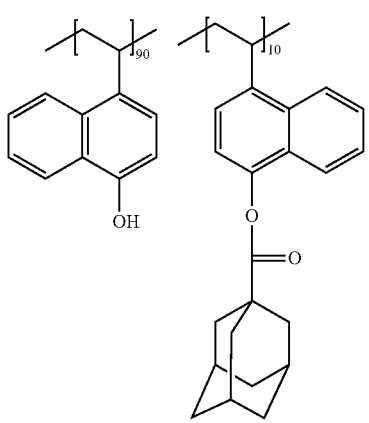
Tg ≥ 140° C.
Polydispersity 1.15
Mw = 3500
-continued
38
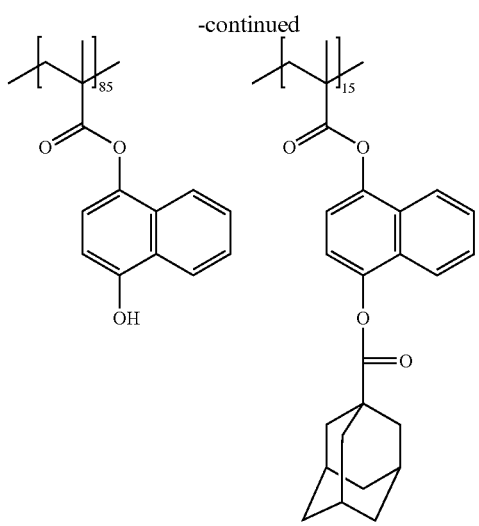
Tg ≥ 140° C.
Polydispersity 1.15
Mw = 3500
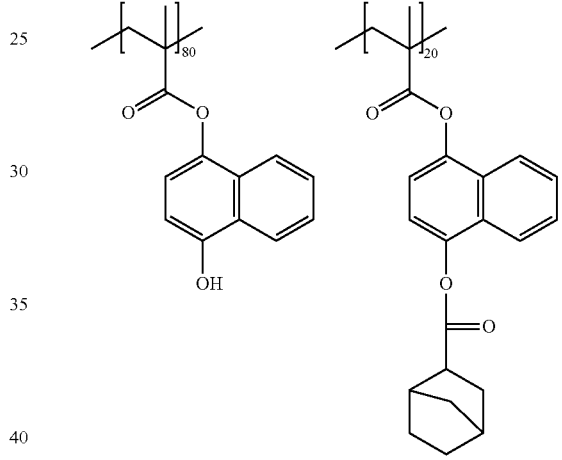
Tg ≥ 140° C.
Polydispersity 1.15
Mw = 3500
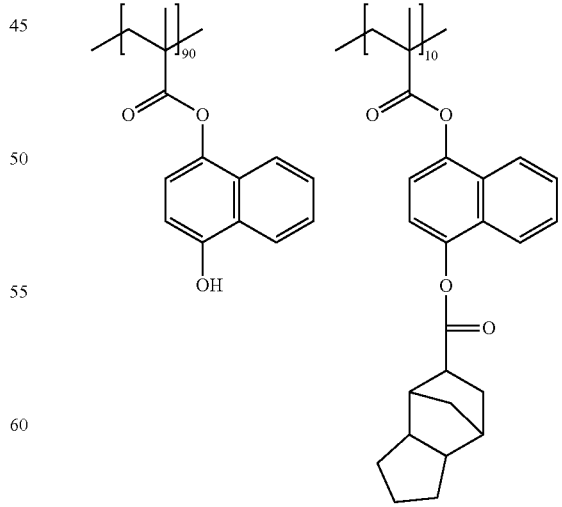
Tg ≥ 140° C.
Polydispersity 1.15
Mw = 3500

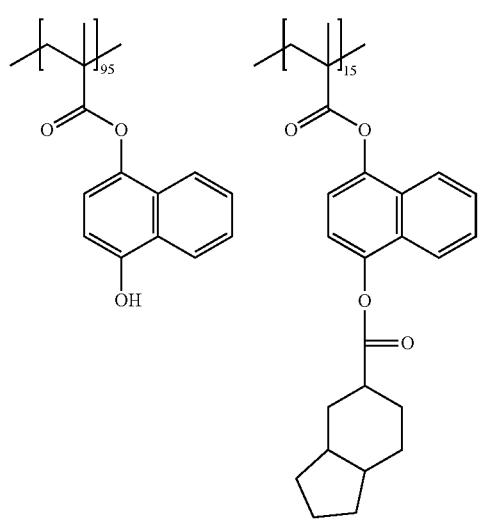
Tg ≥ 140° C.
Polydispersity 1.15
Mw = 3500
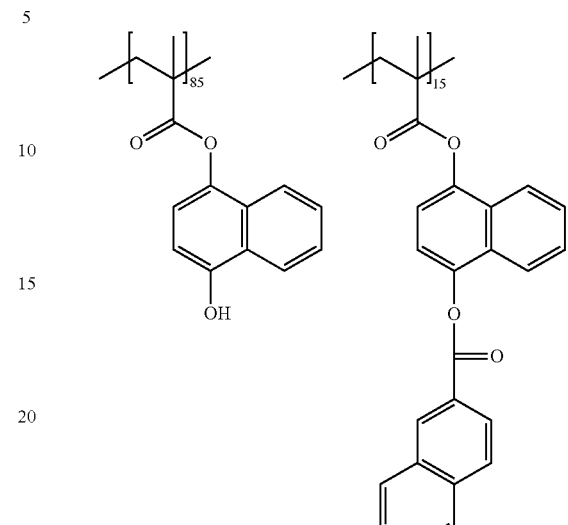
Tg ≥ 140° C.
Polydispersity 1.15
Mw = 3500
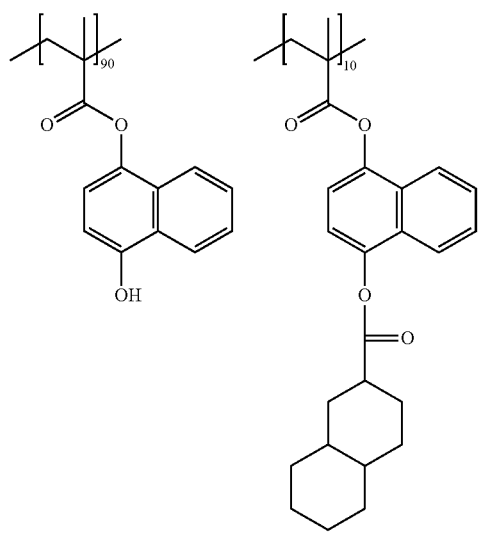
Tg ≥ 140° C.
Polydispersity 1.15
Mw = 3500
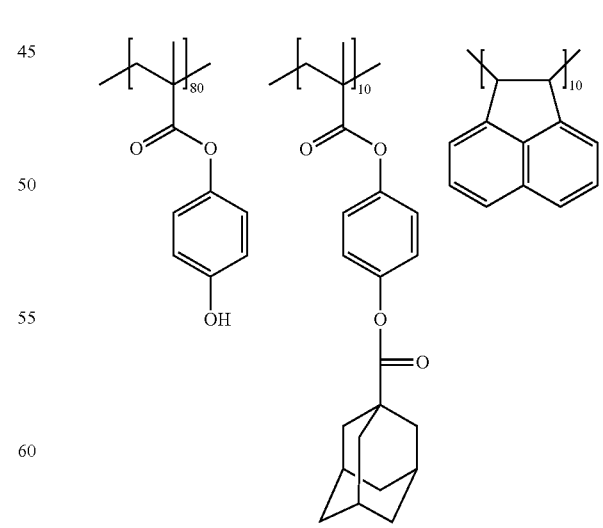
Tg ≥ 140° C.
Polydispersity 1.15
Mw = 4000

41
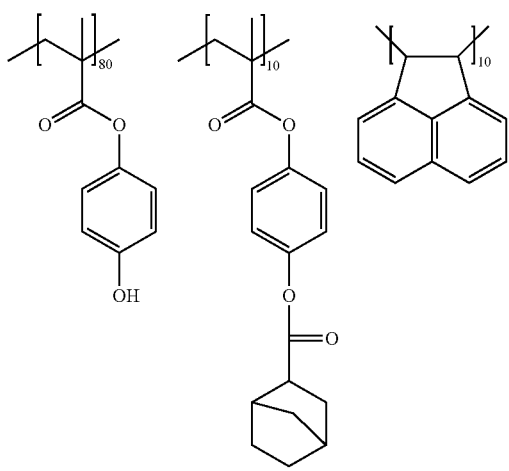
Tg ≥ 140° C.
Polydispersity 1.15
Mw = 3500
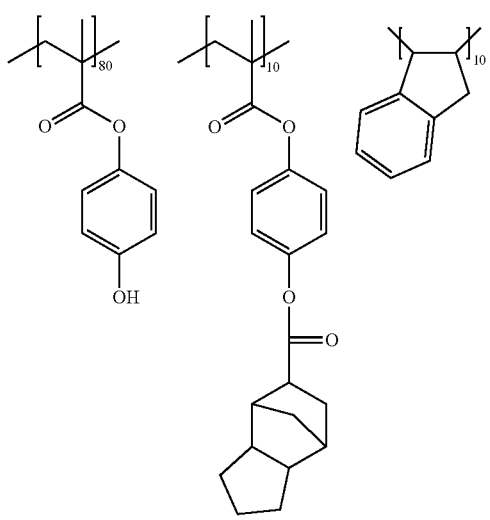
Tg ≥ 140° C.
Polydispersity 1.15
Mw = 3500
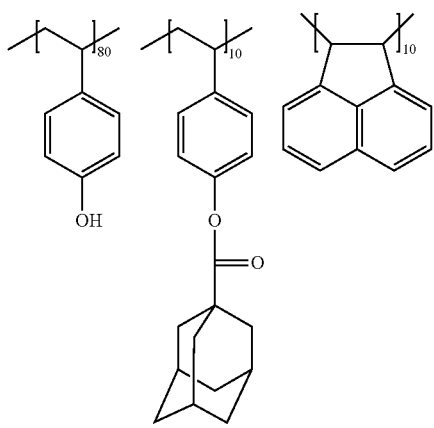
Tg ≥ 140° C.
Polydispersity 1.15
Mw = 3500
42
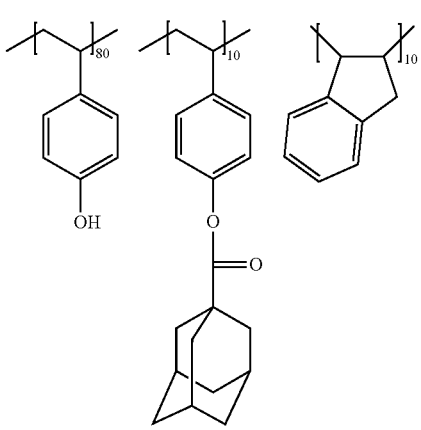
Tg ≥ 140° C.
Polydispersity 1.15
Mw = 3500
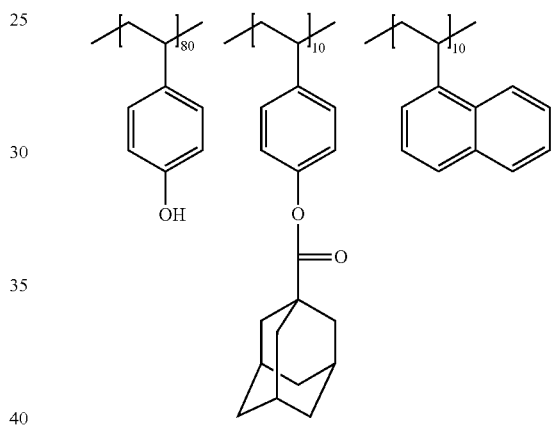
Tg ≥ 140° C.
Polydispersity 1.15
Mw = 3500
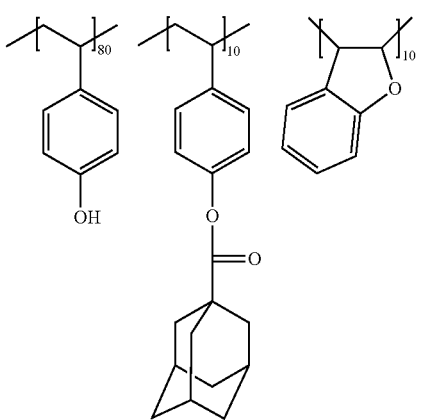
Tg ≥ 140° C.
Polydispersity 1.15
Mw = 3500

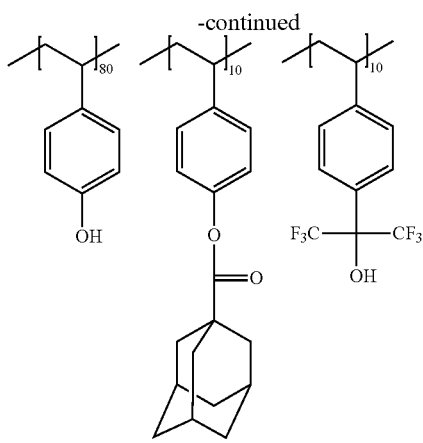

Tg ≥ 140° C.
Polydispersity 1.15
Mw = 3500

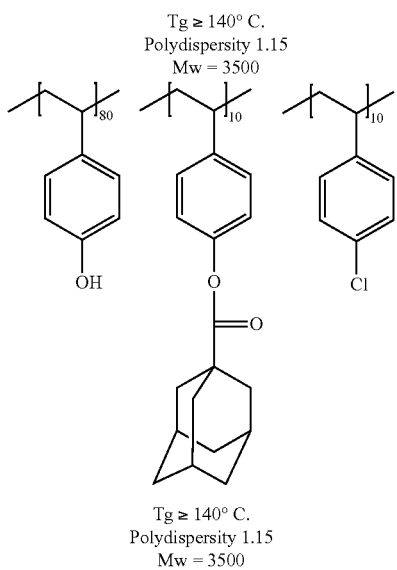

Tg ≥ 140° C.
Polydispersity 1.15
Mw = 3500

[2] (B) Compound Capable of Generating Acid Upon Irradiation with Actinic Ray or Radiation The chemical amplification resist composition of the present invention preferably contain (B) a compound capable of generating an acid upon irradiation with an actinic ray or radiation (hereinafter, if appropriate, sometimes simply referred to as an "acid generator").

A preferred embodiment of the acid generator is an onium compound. Examples of the onium compound include a sulfonium salt, an iodonium salt and a phosphonium salt.

Another preferred embodiment of the acid generator is a compound capable of generating a sulfonic acid, an imide acid or a methide acid upon irradiation with an actinic ray or radiation. Examples of the acid generator in this embodiment include a sulfonium salt, an iodonium salt, a phosphonium salt, oxime sulfonate and imidosulfonate.

The acid generator for use in the present invention is not limited to a low molecular compound, and a compound where a group capable of generating an acid upon irradiation with an actinic ray or radiation is introduced into the main or side chain of a polymer compound may be also used. Furthermore, in the case where, as described above, a group capable of generating an acid upon irradiation with an actinic ray or radiation is present in a repeating unit serving as a copolymerization component of the polymer compound (A) for use in the present invention, the acid generator (B) as a molecule different from the polymer compound of the present invention may not be contained.

The acid generator is preferably a compound capable of generating an acid upon irradiation with an electron beam or an extreme-ultraviolet ray.

In the present invention, the onium compound is preferably a sulfonium compound represented by the following formula (1) or an iodonium compound represented by formula (2):

In formulae (1) and (2), each of $R_{a1}$, $R_{a2}$, $R_{a3}$, $R_{a4}$ and $R_{a5}$ independently represents an organic group, and $X^-$ represents an organic anion.

The sulfonium compound represented by formula (1) and the iodonium compound represented by formula (2) are described in detail below.

Each of $R_{a1}$ to $R_{a3}$ in formula (1) and $R_{a4}$ and $R_{a5}$ in formula (2) independently represents an organic group, but at least one of $R_{a1}$ to $R_{a3}$ and at least one of $R_{a4}$ and $R_{a5}$ each is preferably an aryl group. The aryl group is preferably a phenyl group or a naphthyl group, more preferably a phenyl group.

Examples of the organic anion of $X^-$ in formulae (1) and (2) include a sulfonate anion, a carboxylate anion, a bis(alkylsulfonyl)imide anion and a tris(alkylsulfonyl)methide anion. The organic anion is preferably an organic anion represented by the following formula (3), (4) or (5), more preferably an organic anion represented by the following formula (3):

In formulae (3), (4) and (5), each $Rc_1$, $Rc_2$, $Rc_3$ and $Rc_4$ represents an organic group.

The organic anion of $X^-$ corresponds to a sulfonic acid, an imide acid or a methide acid which are an acid generated upon irradiation with an actinic ray or radiation such as electron beam and extreme-ultraviolet ray.

Examples of the organic group of $R_{c1}$ to $R_{c4}$ include an alkyl group, an aryl group, and a group formed by combining a plurality of such groups. Among these organic groups, an alkyl group substituted with a fluorine atom or a fluoroalkyl group at the 1-position, and a phenyl group substituted with a fluorine atom or a fluoroalkyl group, are preferred. By having a fluorine atom or a fluoroalkyl group, the acidity of the acid generated by light irradiation is increased and the sensitivity is enhanced. However, the terminal group preferably contains no fluorine atom as a substituent.

In the present invention, from the standpoint of constraining the acid generated by exposure from diffusing to the unexposed area and improving the resolution or pattern profile, the (B) compound capable of generating an acid is preferably a compound capable of generating an acid of a size with a volume of 130 Å$^3$ or more (preferably a sulfonic acid), more preferably a compound capable of generating an acid of a size with a volume of 190 Å$^3$ or more (preferably a sulfonic acid), still more preferably a compound capable of generating an acid of a size with a volume of 230 Å$^3$ or more (preferably a sulfonic acid), yet still more preferably a compound capable of generating an acid of a size with a volume of 270 Å$^3$ or more (preferably a sulfonic acid), even yet still more preferably a compound capable of generating an acid of a size with a volume of 400 Å$^3$ or more (preferably a sulfonic acid). However, in view of sensitivity or solubility in the coating solvent, the volume above is preferably 2,000 Å$^3$ or less, more preferably 1,500 Å$^3$ or less. The value of the volume above was determined using "WinMOPAC" produced by Fujitsu Limited. That is, first, the chemical structure of the acid in each example is input; next, using this structure as an initial structure, the most stable steric configuration of each acid is determined by molecular force field calculation using an MM3 method; and thereafter, molecular orbital calculation using a PM3 method is performed with respect to the most stable steric conformation, whereby the "accessible volume" of each acid can be computed.

Examples of the acid generator particularly preferred in the present invention are illustrated below. In some of these examples, the calculated value of volume (unit: Å$^3$) is shown together. The calculated value determined here is a volume value of an acid where a proton is bonded to the anion moiety.

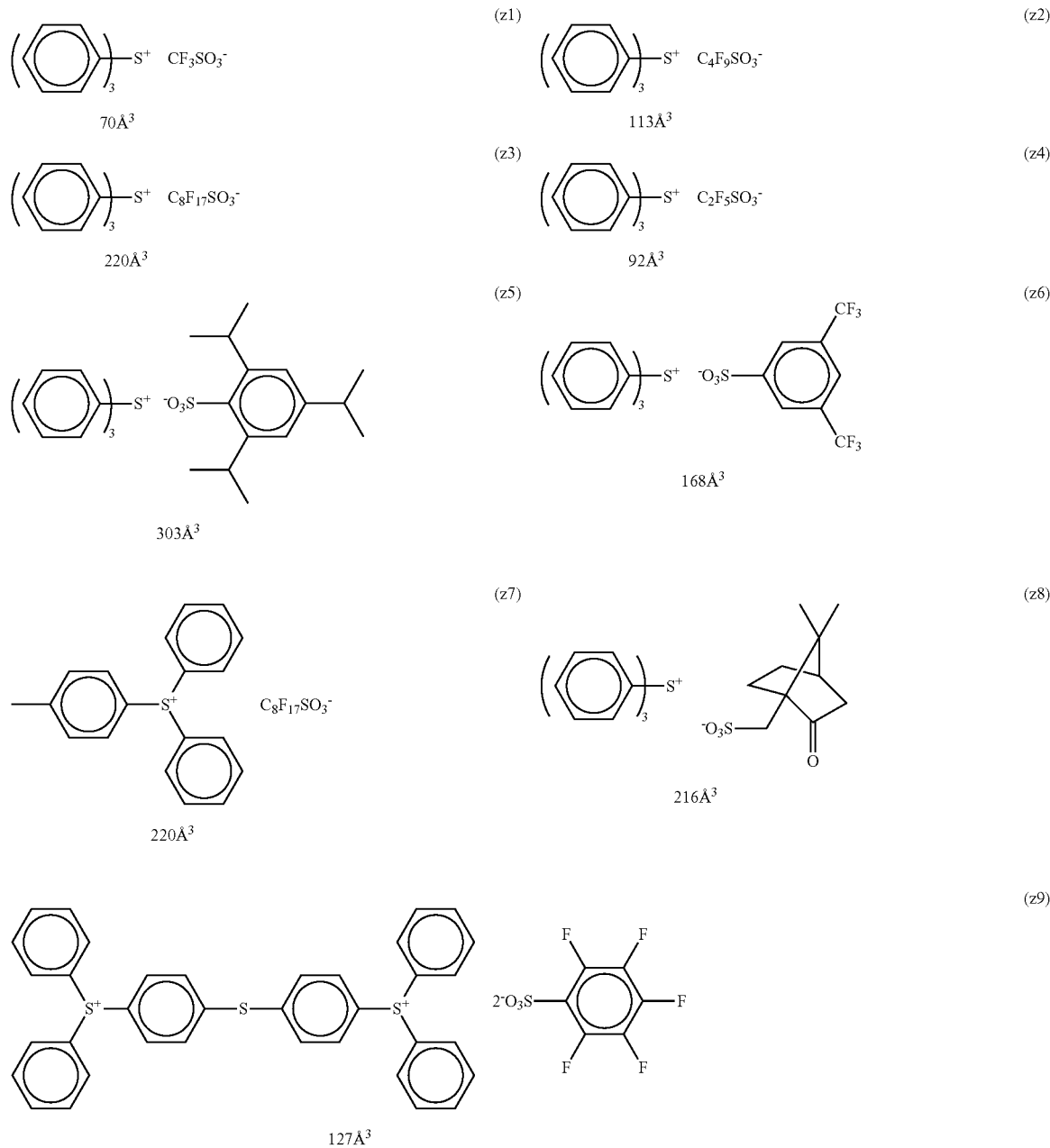

-continued
(z10)
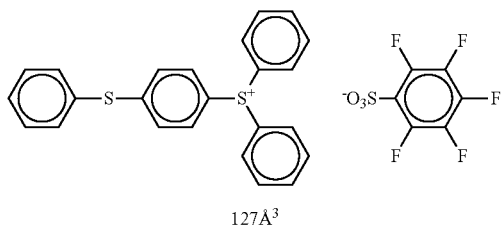
127Å³
(z11)
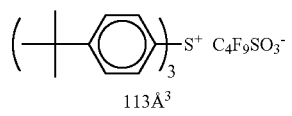
113Å³
(z12)
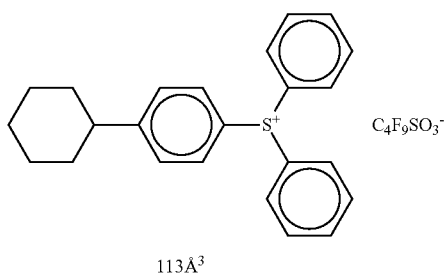
113Å³
(z13)
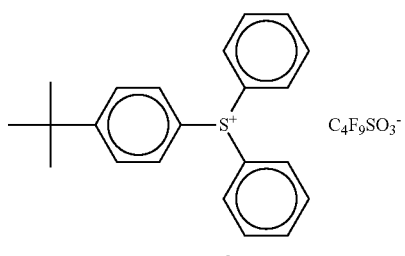
113Å³
(z14)
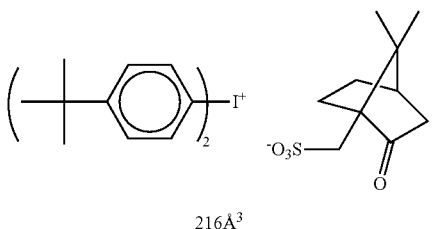
216Å³
(z15)
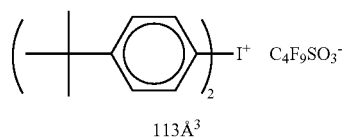
113Å³
(z16)
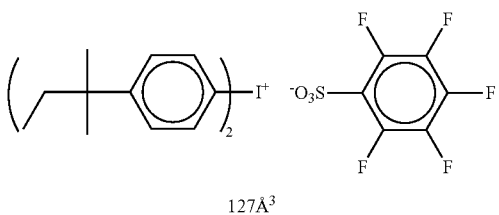
127Å³
(z17)
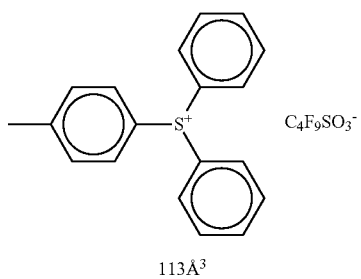
113Å³
(z18)
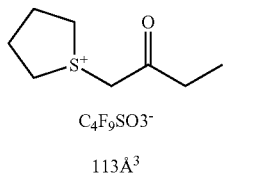
C₄F₉SO₃⁻
113Å³
(z19)
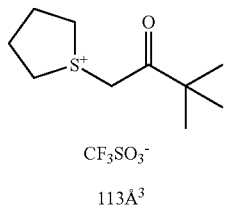
CF₃SO₃⁻
113Å³
(z20)
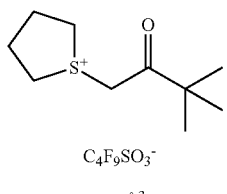
C₄F₉SO₃⁻
113Å³
(z21)
C₄F₉SO₃⁻
113Å³

-continued
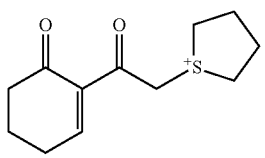
(z22)
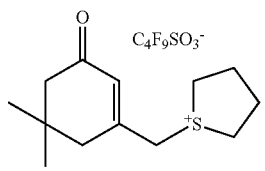
(z23)
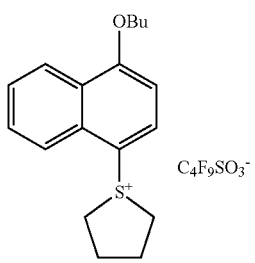
(z24)
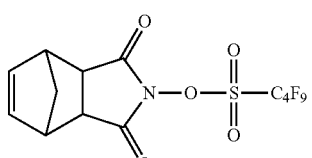
(z25)
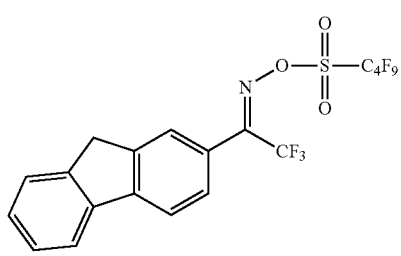
(z26)
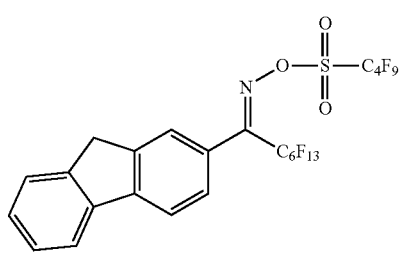
(z27)
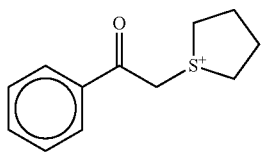
(z28)
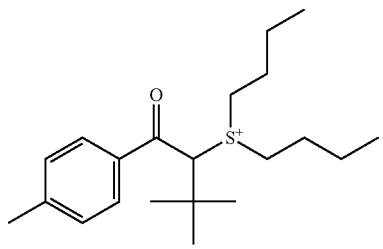
(z29)
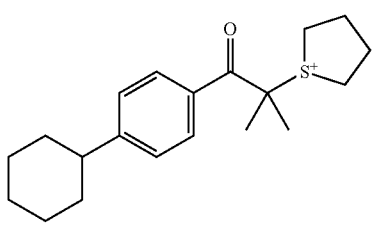
(z30)
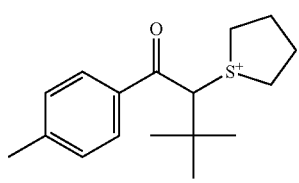
(z31)

-continued
(z32)
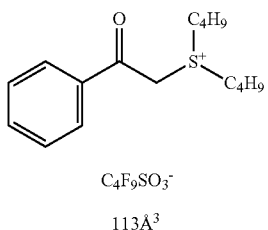
C$_4$F$_9$SO$_3^-$
113Å$^3$
(z33)
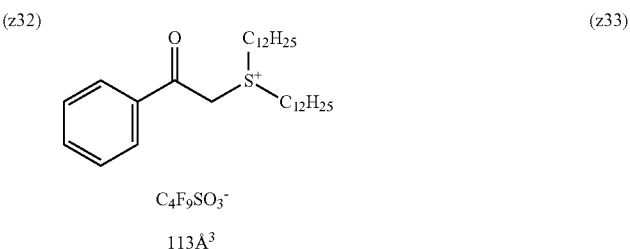
C$_4$F$_9$SO$_3^-$
113Å$^3$
(z34)
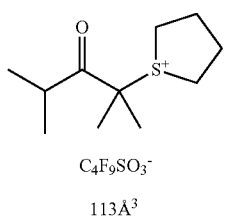
C$_4$F$_9$SO$_3^-$
113Å$^3$
(z35)
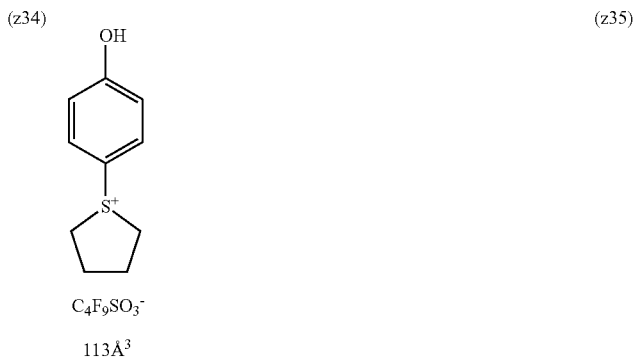
C$_4$F$_9$SO$_3^-$
113Å$^3$
(z36)
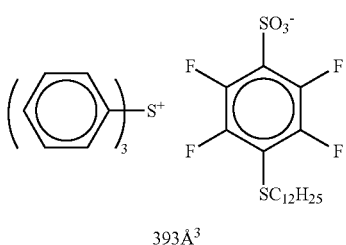
393Å$^3$
(z37)
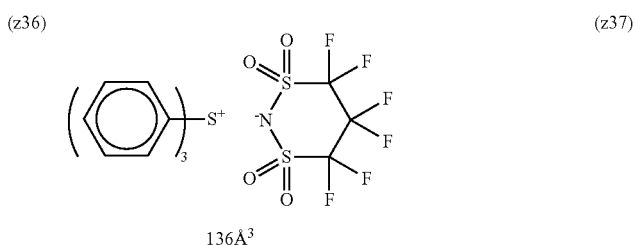
136Å$^3$
(z38)
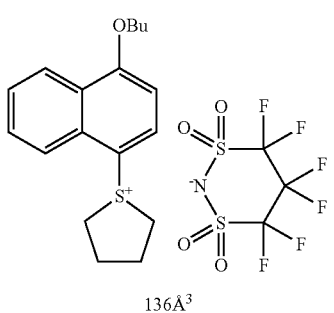
136Å$^3$
(z39)
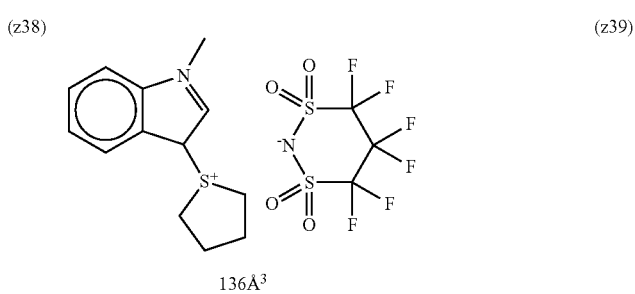
136Å$^3$
(z40)
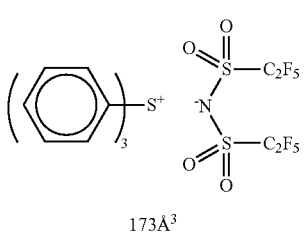
173Å$^3$
(z41)
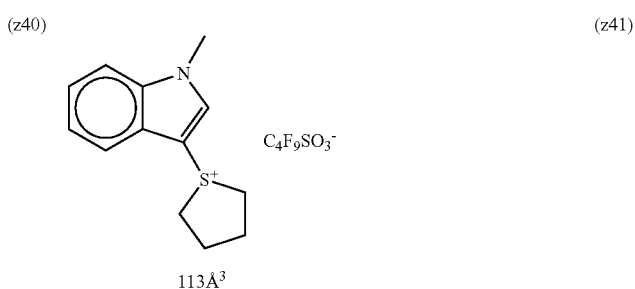
113Å$^3$ -continued
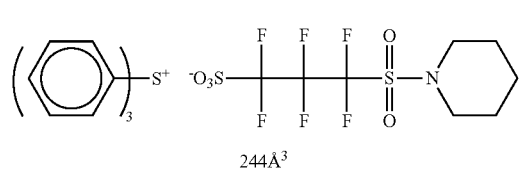
(z42)
244Å³
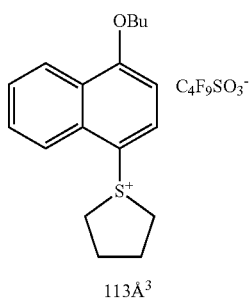
(z43)
113Å³
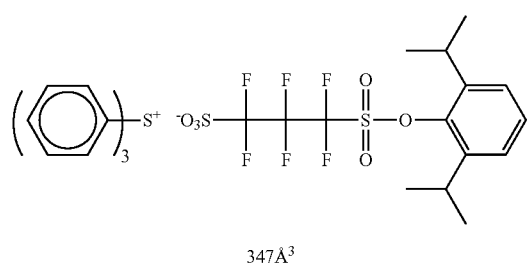
(z44)
347Å³
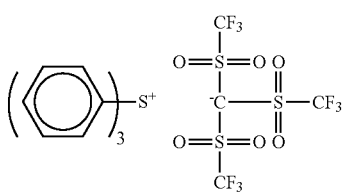
(z45)
189Å³
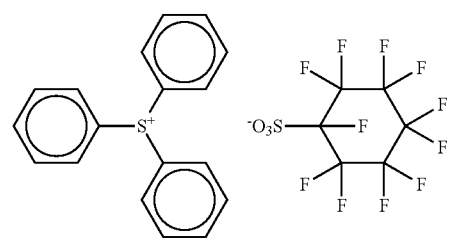
(z46)
136Å³
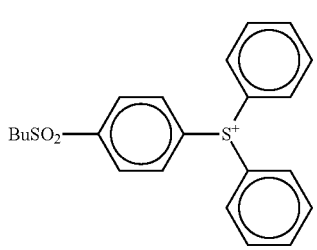
(z47)
113Å³
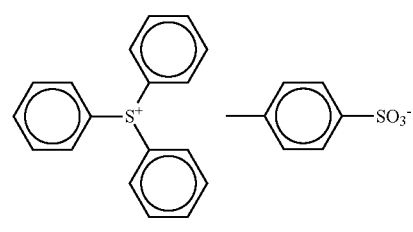
(z48)
186Å³
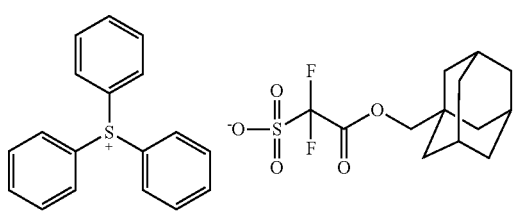
(z49)
271Å³
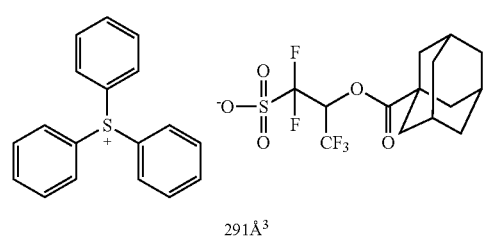
(z50)
291Å³
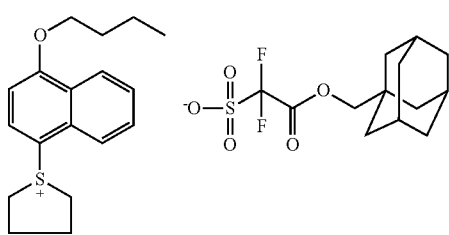
(z51)
271Å³

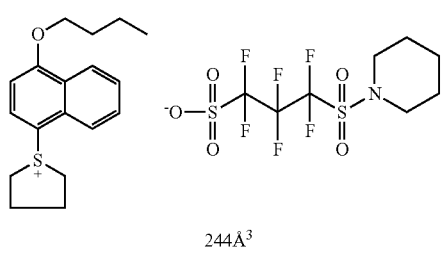
(z52)
244Å³
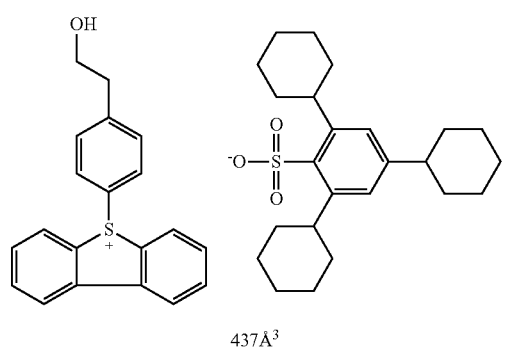
(z53)
437Å³
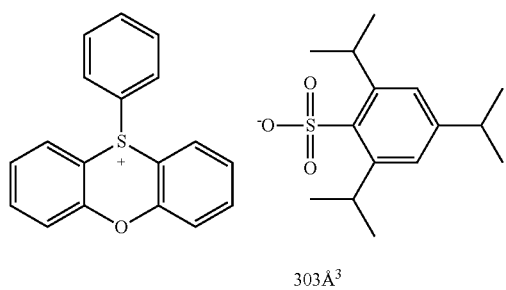
(z54)
303Å³
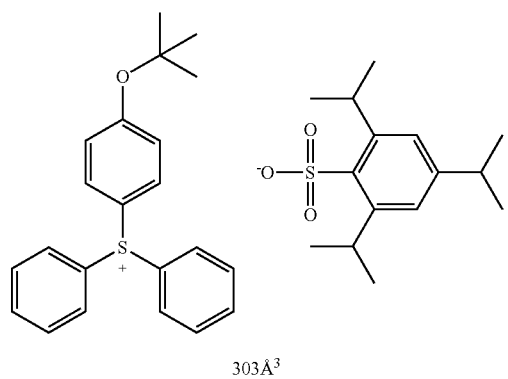
(z55)
303Å³
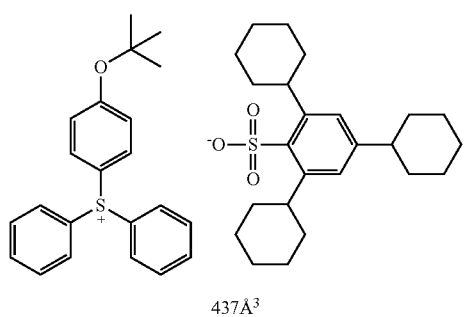
(z56)
437Å³
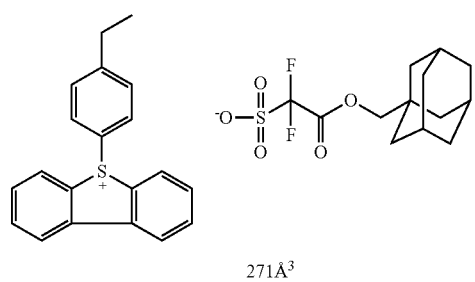
(z57)
271Å³
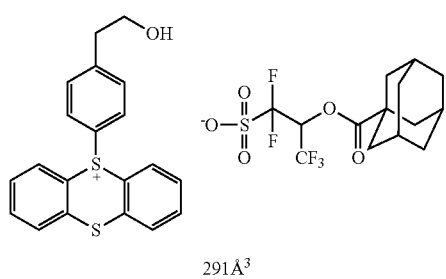
(z58)
291Å³
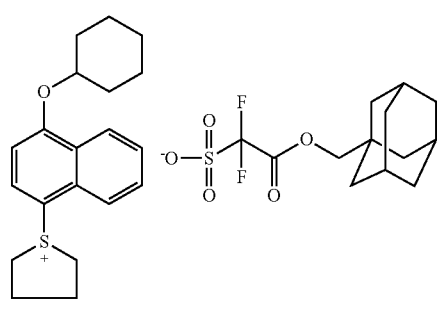
(z59)
271Å³

-continued
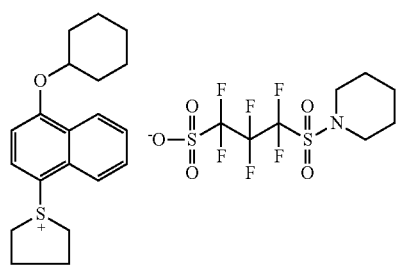
244Å³ (z60)
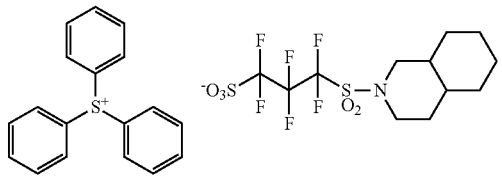
311Å³ (z61)
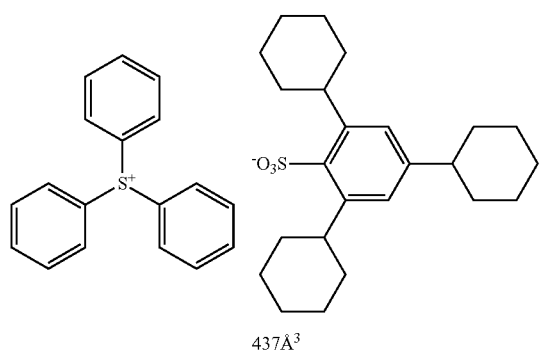
437Å³ (z62)
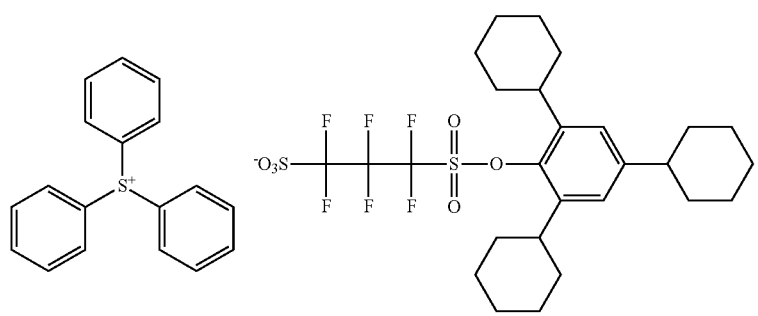
535Å³ (z63)
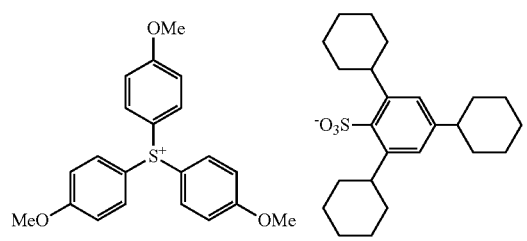
437Å³ (z64)
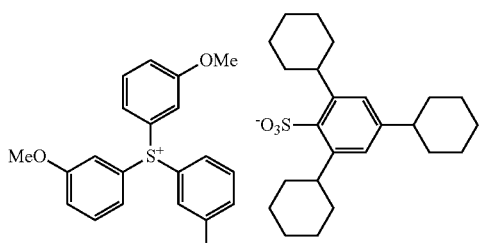
437Å³ (z65)

-continued

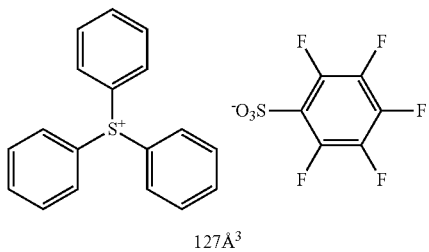

(z66)

127Å³

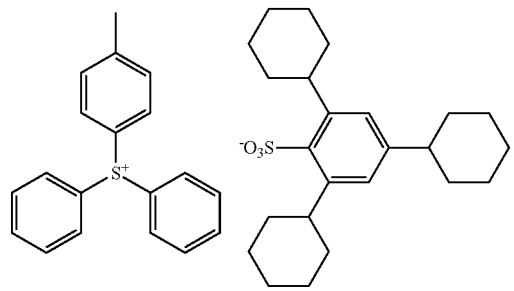

(z67)

437Å³

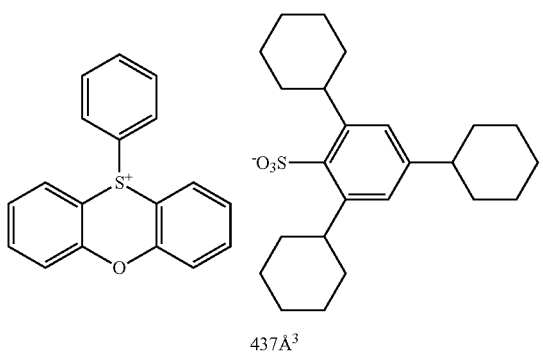

(z68)

437Å³

As the acid generator (preferably an onium compound) for use in the present invention, a polymer-type acid generator where a group capable of generating an acid upon irradiation with an actinic ray or radiation (photoacid generating group) is introduced into the main or side chain of a polymer compound may be also used, and this acid generator is described as a repeating unit having a photoacid generating group in connection with the polymer compound (A).

The content of the acid generator in the composition is preferably from 0.1 to 25 mass %, more preferably from 0.5 to 20 mass %, still more preferably from 1 to 18 mass %, based on the entire solid content of the resist composition.

One kind of an acid generator may be used alone, or two or more kinds of acid generators may be used in combination.

[3] (C) Compound Capable of Crosslinking Polymer Compound (A) by the Action of Acid The chemical amplification resist composition of the present invention preferably contains a compound capable of crosslinking the polymer compound (A) by the action of an acid (hereinafter, sometimes referred to as an "acid crosslinking agent" or simply as a "crosslinking agent").

The crosslinking compound is preferably a compound having, as a crosslinkable group, two or more hydroxymethyl groups or alkoxymethyl groups within the molecule.

Preferred crosslinking agents include hydroxyethylated or alkoxymethylated phenol compounds, alkoxymethylated melamine-based compounds, alkoxymethyl glycoluril-based compounds, and acyloxymethylated urea-based compounds. The compound (C) particularly preferred as the crosslinking agent is a phenol derivative having a molecular weight of 1,200 or less and containing, within the molecule, from 3 to 5 benzene rings and a total of two or more hydroxymethyl groups or alkoxymethyl groups, a melamine-formaldehyde derivative having at least two free N-alkoxymethyl groups, or an alkoxymethyl glycoluril derivative.

The alkoxymethyl group is preferably a methoxymethyl group or an ethoxymethyl group.

Out of the crosslinking agents above, the phenol derivative having a hydroxymethyl group can be obtained by reacting a phenol compound having no corresponding hydroxymethyl group with formaldehyde in the presence of a base catalyst. Also, the phenol derivative having an alkoxymethyl group can be obtained by reacting a phenol derivative having a corresponding hydroxymethyl group with an alcohol in the presence of an acid catalyst.

Among the thus-synthesized phenol derivatives, a phenol derivative having an alkoxymethyl group is preferred in view of sensitivity and storage stability.

Other preferred examples of the crosslinking agent include alkoxymethylated melamine-based compounds, alkoxymethyl glycoluril-based compounds, and compounds having an N-hydroxymethyl group or an N-alkoxymethyl group, such as alkoxymethylated urea-based compound.

Examples of these compounds include hexamethoxymethylmelamine, hexaethoxymethylmelamine, tetramethoxymethyl glycoluril, 1,3-bismethoxymethyl-4,5-bismethoxyethyleneurea, and bismethoxymethylurea, which are disclosed in EP 0,133,216A, German Patents 3,634,671 and 3,711,264, and EP 0,212,482A.

Among these crosslinking agents, particularly preferred are those illustrated below.

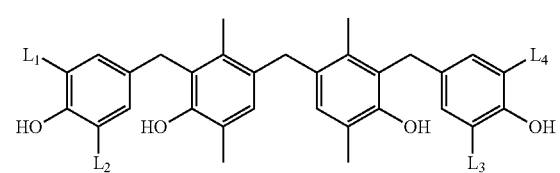

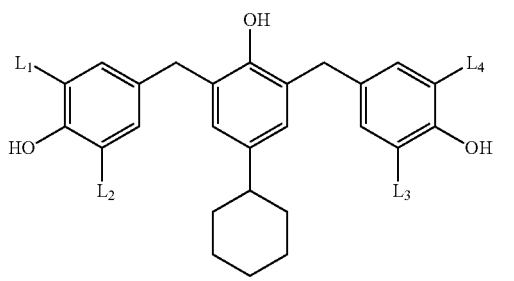
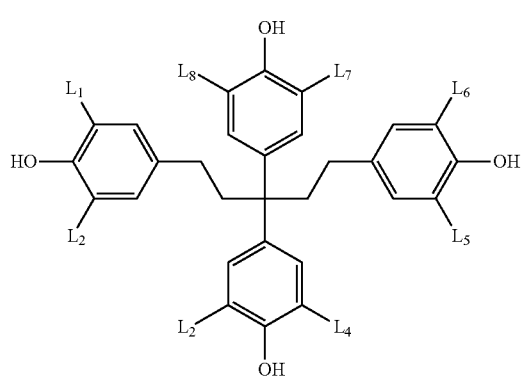
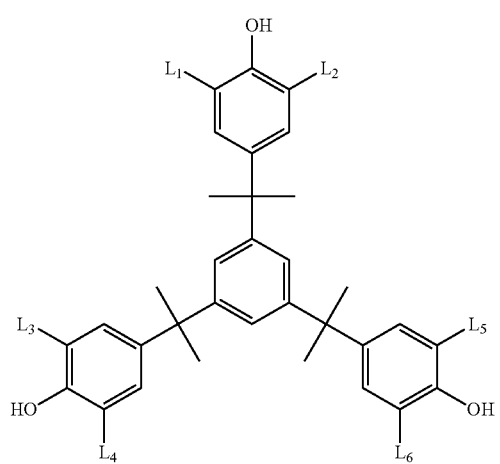
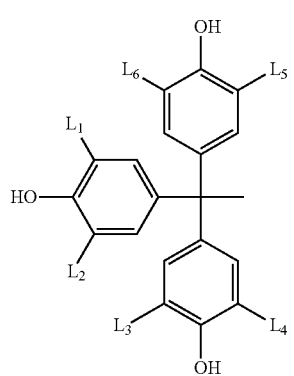
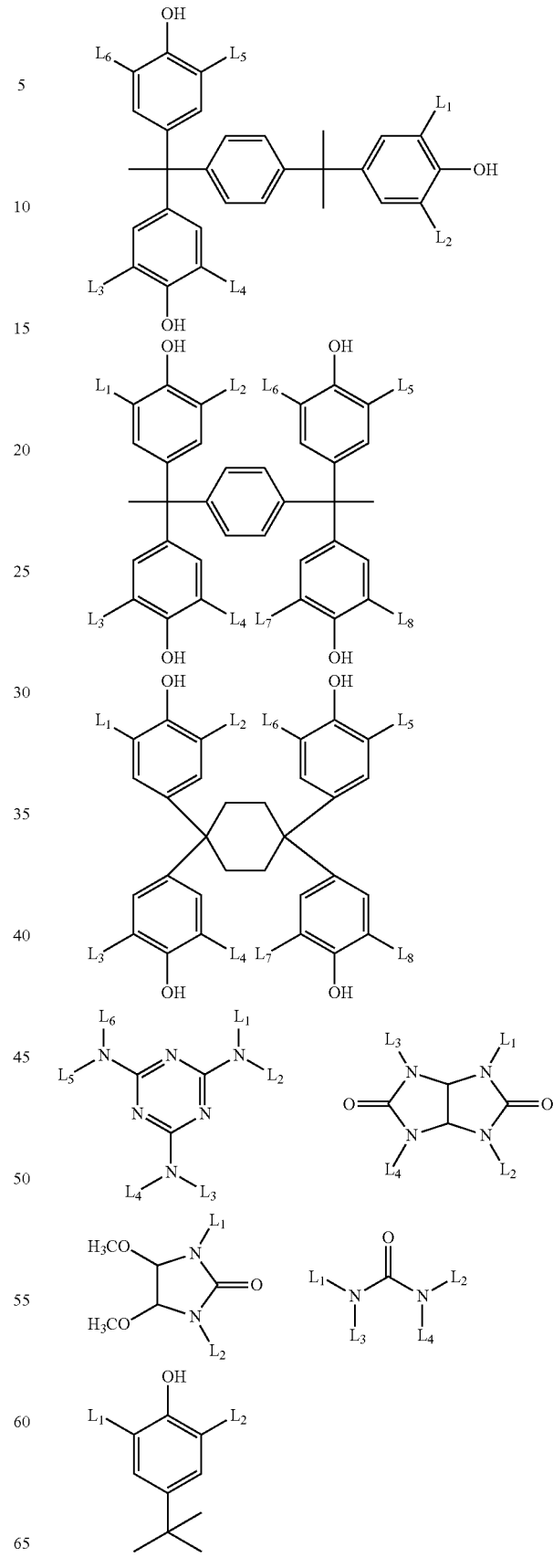

In these formulae, each of $L_1$ to $L_8$ independently represents a hydrogen atom, a hydroxymethyl group, a methoxymethyl group, an ethoxymethyl group, or an alkyl group having a carbon number of 1 to 6.

In the present invention, the crosslinking agent is used in an amount added of preferably from 3 to 65 mass %, more preferably from 5 to 50 mass %, based on the solid content of the resist composition. When the amount added of the crosslinking agent is from 3 to 65 mass %, the residual film ratio and the resolution can be prevented from reduction and at the same time, good stability of the resist solution can be kept during storage.

In the present invention, one kind of a crosslinking agent may be used alone, or two or more kinds of crosslinking agents may be used in combination, and in view of the pattern profile, two or more kinds of crosslinking agents are preferably used in combination.

For example, in the case of using the phenol derivative and additionally using another crosslinking agent, for example, the above-described compound having an N-alkoxymethyl group, in combination, the ratio between the phenol derivative and another crosslinking agent is, in terms of molar ratio, from 100/0 to 20/80, preferably from 90/10 to 40/60, more preferably from 80/20 to 50/50.

[4] Basic Compound

The chemical amplification resist composition of the present invention preferably contains a basic compound as an acid scavenger, in addition to the components described above. By using a basic compound, the change of performance with aging from exposure to post-baking can be reduced. The basic compound is preferably an organic basic compound, and specific examples thereof include aliphatic amines, aromatic amines, heterocyclic amines, nitrogen-containing compounds having a carboxyl group, nitrogen-containing compounds having a sulfonyl group, nitrogen-containing compounds having a hydroxy group, nitrogen-containing compounds having a hydroxyphenyl group, alcoholic nitrogen-containing compounds, amide derivatives, and imide derivatives. An amine oxide compound (described in JP-A-2008-102383) and an ammonium salt (preferably a hydroxide or a carboxylate; more specifically, a tetraalkylammonium hydroxide typified by tetrabutylammonium hydroxide is preferred in view of LER) may be also appropriately used.

Furthermore, a compound capable of increasing the basicity by the action of an acid can be also used as a kind of the basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(tert-butyl)aniline, triethanolamine, N,N-dihydroxyethylaniline, tris(methoxyethoxyethyl)amine, compounds exemplified in column 3, line 60 et seq. of U.S. Pat. No. 6,040,112, 2-[2-{2-(2,2-dimethoxy-phenoxyethoxy) ethyl}bis-(2-methoxyethyl)]-amine, and Compounds (C1-1) to (C3-3) illustrated in paragraph [0066] of U.S. Patent Application Publication No. 200710224539A1. Examples of the compound having a nitrogen-containing heterocyclic structure include 2-phenylbenzimidazole, 2,4,5-triphenylimidazole, N-hydroxyethylpiperidine, bis(1,2,2,6,6-pentamethyl-4-piperidyl) sebacate, 4-dimethylaminopyridine, antipyrine, hydroxyantipyrine, 1,5-diazabicyclo[4.3.0]-non-5-ene, 1,8-diazabicyclo[5.4.0]-undec-7-ene, and tetrabutylammonium hydroxide.

In addition, a photodecomposable basic compound (a compound which initially exhibits basicity due to the action of a basic nitrogen atom as a base but decomposes upon irradiation with an actinic ray or radiation to generate a zwitterionic compound having a basic nitrogen atom and an organic acid moiety and resulting from their neutralization in the molecule, is reduced in or deprived of the basicity; for example, onium salts described in Japanese Patent No. 3,577,743, JP-A-2001-215689, JP-A-2001-166476 and JP-A-2008-102383), and a photobase generator (for example, compounds described in JP-A-2010-243773) may be also appropriately used.

Among these basic compounds, an ammonium salt and a photodecomposable basic compound are preferred from the standpoint that a good cross-sectional profile is obtained.

The content of the basic compound for use in the present invention is preferably from 0.01 to 10 mass %, more preferably from 0.03 to 5 mass %, still more preferably from 0.05 to 3 mass %, based on the entire solid content of the resist composition.

[5] Surfactant

The chemical amplification resist composition of the present invention may further contain a surfactant so as to enhance the coatability. The surfactant is not particularly limited, but examples thereof include a nonionic surfactant such as polyoxyethylene alkyl ethers, polyoxyethylene alkylallyl ethers, polyoxyethylene-polyoxypropylene block copolymers, sorbitan fatty acid esters and polyoxyethylene sorbitan fatty acid esters, a fluorine-containing surfactant such as Megaface F171 (produced by Dainippon Ink & Chemicals, Inc.), Florad FC430 (produced by Sumitomo 3M, Inc.), Surfynol E1004 (produced by Asahi Glass Co., Ltd.), and PF656 and PF6320 produced by OMNOVA, and an organosiloxane polymer.

In the case where the resist composition contains a surfactant, the amount of the surfactant used is preferably from 0.0001 to 2 mass %, more preferably from 0.0005 to 1 mass %, based on the entire amount of the resist composition (excluding the solvent).

[6] Organic Carboxylic Acid

The chemical amplification resist composition of the present invention preferably contains an organic carboxylic compound, in addition to the components described above. Examples of the organic carboxylic compound include an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid derivative, a phthalic acid, a terephthalic acid, an isophthalic acid, a 2-naphthoic acid, a 1-hydroxy-2-naphthoic acid, and a 2-hydroxy-3-naphthoic acid. At the time of performing electron beam exposure in vacuum, the organic carboxylic acid may vaporize from the resist film surface to contaminate the lithography chamber and therefore, the preferred compound is an aromatic organic carboxylic acid. Above all, for example, a benzoic acid, a 1-hydroxy-2-naphthoic acid and a 2-hydroxy-3-naphthoic acid are more preferred.

The amount of the organic carboxylic acid blended is preferably from 0.01 to 10 parts by mass, more preferably from 0.01 to 5 parts by mass, still more preferably from 0.01 to 3 parts by mass, per 100 parts by mass of the polymer compound (A).

The chemical amplification resist composition of the present invention may further contain, if desired, a dye, a plasticizer, and an acid-increasing agent (described, for example, in International Publication Nos. 95/29968 and 98/24000, JP-A-8-305262, JP-A-9-34106, JP-A-8-248561, JP-T-8-503082 (the term "JP-T" as used herein means a published Japanese translation of a PCT patent application), U.S. Pat. No. 5,445,917, JP-T-8-503081, U.S. Pat. Nos. 5,534,393, 5,395,736, 5,741,630, 5,334,489, 5,582,956, 5,578,424, 5,453,345 and 5,445,917, European Patent Nos. 665,960, 757,628 and 665,961, U.S. Pat. No. 5,667,943, JP-A-10-1508, JP-A-10-282642, JP-A-9-512498, JP-A-2000-62337, JP-A-2005-17730 and JP-A-2008-209889). As for all of these compounds, examples thereof include those described for respective compounds in JP-A-2008-268935.

[Onium Carboxylate]

The resist composition of the present invention may contain an onium carboxylate. Examples of the onium carboxylate include sulfonium carboxylate, iodonium carboxylate and ammonium carboxylate. In particular, the onium carboxylate is preferably iodonium carboxylate or sulfonium carboxylate. Furthermore, in the present invention, it is preferred that the carboxylate residue of the onium carboxylate does not contain an aromatic group and a carbon-carbon double bond. The anion moiety is preferably a linear or branched, monocyclic or polycyclic alkylcarboxylate anion having a carbon number of 1 to 30, more preferably the carboxylate anion above in which the alkyl group is partially or entirely fluorine-substituted. The alkyl chain may contain an oxygen atom. Thanks to such a configuration, the transparency to light at a wavelength of 220 nm or less is ensured, the sensitivity and resolution are enhanced, and the iso/dense bias and exposure margin are improved.

Preferred examples of the solvent used for the resist composition of the present invention include ethylene glycol monoethyl ether acetate, cyclohexanone, 2-heptanone, propylene glycol monomethyl ether (PGME, another name: 1-methoxy-2-propanol), propylene glycol monomethyl ether acetate (PGMEA, another name: 1-methoxy-2-acetoxypropane), propylene glycol monomethyl ether propionate, propylene glycol mono ethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethyl-formamide, γ-butyrolactone, N,N-dimethylacetamide, propylene carbonate and ethylene carbonate. One of these solvents may be used alone, or some may be used in combination.

The resist composition is preferably prepared by dissolving the components in the solvent about to give a solid content of, in terms of solid content concentration, from 1 to 40 mass %, more preferably from 1 to 30 mass %, still more preferably from 3 to 20 mass %.

The present invention also relates to a resist film formed using the chemical amplification resist composition of the present invention, and the resist film is formed, for example, by coating the resist composition on a support such as substrate. The thickness of the resist film is preferably from 10 to 150 nm, more preferably from 10 to 120 nm. As for the method to coat the resist composition on a substrate, the composition is coated on a substrate by an appropriate coating method such as spin coating, roll coating, flow coating, dip coating, spray coating and doctor coating, but spin coating is preferred, and the spinning speed is preferably from 1,000 to 3,000 rpm. The coated film is pre-baked at 60 to 150° C. for 1 to 20 minutes, preferably at 80 to 120° C. for 1 to 10 minutes, to form a thin film.

As for the materials constituting the substrate to be processed and the outermost surface layer thereof, for example, in the case of a wafer for semiconductor, a silicon wafer can be used, and examples of the material working out to the outermost surface include Si, $SiO_2$, SiN, SiON, TiN, WSi, BPSG, SOG, and an organic antireflection film.

The present invention also relates to a resist-coated mask blank coated with the resist film obtained as above. In order to obtain such a resist-coated mask blank, in the case of forming a resist pattern on a photomask blank for the production of a photomask, the transparent substrate used includes a transparent substrate such as quartz and calcium fluoride. In general, a light-shielding film, an antireflection film, further a phase shift film, and additionally a required functional film such as etching stopper film and etching mask film, are stacked on the substrate. As for the material of the functional film, a film containing silicon or a transition metal such as chromium, molybdenum, zirconium tantalum, tungsten, titanium and niobium is stacked. Examples of the material used for the outermost layer include a material where the main constituent material is a material containing silicon or containing silicon and oxygen and/or nitrogen, a silicon compound material where the main constituent material is the material above which further contains a transition metal, and a transition metal compound material where the main constituent material is a material containing a transition metal, particularly, one or more transition metals selected from chromium, molybdenum, zirconium, tantalum, tungsten, titanium and niobium, or further containing one or more elements selected from oxygen, nitrogen and carbon.

The light-shielding film may have a single-layer structure but preferably has a multilayer structure where a plurality of materials are coated one on another. In the case of a multilayer structure, the film thickness per layer is not particularly limited but is preferably from 5 to 100 nm, more preferably from 10 to 80 nm. The thickness of the entire light-shielding film is not particularly limited but is preferably from 5 to 200 nm, more preferably from 10 to 150 nm.

Out of the materials above, when pattern formation is performed using a chemical amplification resist composition on a photomask black having in the outermost surface layer thereof a material containing chromium and oxygen or nitrogen, a so-called undercut profile waist-shaped near the substrate is liable to be formed in general. However, when the present invention is used, the undercut problem can be improved as compared with the conventional mask blank.

Subsequently, this resist film is irradiated with an actinic ray or radiation (e.g., electron beam), preferably baked (usually at 80 to 150° C., preferably from 90 to 130° C.), and then developed, whereby a good pattern can be obtained. Etching, ion implantation or the like is appropriately performed by using this pattern as the mask to produce, for example, a semiconductor fine circuit or an imprint mold structure.

Incidentally, the process when preparing an imprint mold by using the composition of the present invention is described, for example, in Japanese Patent 4,109,085, JP-A-2008-162101 and Yoshihiko Hirai (compiler), Nanoimprint no Kiso to Gijutsu Kaihatsu•Oyo Tenkai—Nanoimprint no Kiban Gijutsu to Saishin no Gijutsu Tenkai (Basic and Technology Expansion•Application Development of Nanoimprint—Substrate Technology of Nanoimprint and Latest Technology Expansion), Frontier Shuppan.

The use mode of the chemical amplification resist composition of the present invention and the pattern forming method are described below.

The present invention also relates to a resist pattern forming method comprising exposing the above-described resist film or resist-coated mask blank and developing the exposed resist film or resist-coated mask blank. In the present invention, the exposure is preferably performed using an electron beam or an extreme-ultraviolet ray.

In the production or the like of a precision integrated circuit device, the exposure of the resist film (pattern forming step) is preferably performed by patternwise irradiating the resist film of the present invention with an electron beam or an extreme-ultraviolet ray (EUV). The exposure is performed with an exposure dose of, in the case of an electron beam, approximately from 0.1 to 20 µC/cm$^2$, preferably on the order of 3 to 10 µC/cm$^2$, and in the case of an extreme-ultraviolet ray, approximately from 0.1 to 20 mJ/cm$^2$, preferably on the order of 3 to 15 mJ/cm$^2$. Thereafter, heating after development (post-exposure baking) is performed on a hot plate at 60 to 150° C. for 1 to 20 minutes, preferably at 80 to 120° C. for 1 to 10 minutes, and subsequently, the resist film is developed, rinsed and dried, whereby a resist pattern is formed.

The developer may be an alkali developer or an organic solvent-containing developer.

Examples of the alkali developer which can be used include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

The alkaline aqueous solution above may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous 2.38 mass % tetramethylammonium hydroxide solution is preferred.

As the organic solvent-containing developer (hereinafter, sometimes referred to as an "organic developer"), a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, amyl acetate, propylene glycol monomethyl ether acetate, ethylene glycol monomethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, the water content ratio in the organic developer is preferably less than 10 mass %, and it is more preferred to contain substantially no water.

That is, the amount of the organic solvent used in the organic developer is preferably from 90 to 100 mass %, more preferably from 95 to 100 mass %, based on the entire amount of the developer.

In particular, the organic developer is preferably a developer containing at least one kind of an organic solvent selected from a ketone-based solvent, an ester-based solvent, an alcohol-based solvent, an amide-based solvent and an ether-based solvent.

In the developer, alcohols and/or a surfactant may be added each in an appropriate amount, if desired.

The surfactant is not particularly limited but, for example, ionic or nonionic fluorine-containing and/or silicon-containing surfactants can be used. Examples of such fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

Examples of the developing method which can be applied include a method of dipping the substrate in a bath filled with the developer for a fixed time (dipping method), a method of raising the developer on the substrate surface by the effect of a surface tension and keeping it still for a fixed time, thereby performing development (puddle method), a method of spraying the developer on the substrate surface (spraying method), and a method of continuously ejecting the developer on the substrate spinning at a constant speed while scanning the developer ejecting nozzle at a constant rate (dynamic dispense method).

In the case where the above-described various developing methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film/resist pattern is kept from inadvertent chipping or collapse.

Here, the ejection pressure (mL/sec/mm$^2$) of the developer is the value at the outlet of the development nozzle in the developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using a developer, a step of stopping the development by replacing the solvent with another solvent may be practiced.

As for the rinsing solution used in a rinsing step performed after alkali development, pure water is used and may be also used after adding an appropriate amount of a surfactant thereto.

The rinsing solution used in the rinsing step performed after development using an organic developer is not particularly limited as long as it does not dissolve the resist pattern, and a solution containing a general organic solvent may be used and may be also used after adding an appropriate amount of a surfactant thereto. A rinsing solution containing at least one kind of an organic solvent selected from a hydrocarbon-based solvent, a ketone-based solvent, an ester-based solvent, an alcohol-based solvent, an amide-based solvent and an ether-based solvent is preferably used as the rinsing solution.

Specific examples of the hydrocarbon-based solvent, ketone-based solvent, ester-based solvent, alcohol-based solvent, amide-based solvent and ether-based solvent are the same as those described above in connection with the organic solvent-containing developer.

After the step of performing development by using an organic solvent-containing developer, more preferably, a step of rinsing the film by using a rinsing solution containing at least one kind of an organic solvent selected from a ketone-based solvent, an ester-based solvent, an alcohol-based solvent and an amide-based solvent is preformed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The water content ratio in the rinsing solution is preferably 10 mass % or less, more preferably 5 mass % or less, still more preferably 3 mass % or less. By setting the water content ratio to 10 mass % or less, good development characteristics can be obtained.

In the rinsing step, the wafer after development is rinsed by using the above-described rinsing solution. The method for rinsing treatment is not particularly limited but, for example, a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method) can be applied. Above all, it is preferred to perform the rinsing treatment by the spin coating method and after the rinsing, remove the rinsing solution from the substrate surface by spinning the substrate at a rotational speed of 2,000 to 4,000 rpm. It is also preferred to include a heating step (Post Bake) after the rinsing step. Thanks to the baking, the developer and rinsing solution remaining between patterns and in the inside of the pattern are removed. The heating step after the rinsing step is performed at usually from 40 to 160° C., preferably from 70 to 95° C., for usually from 10 seconds to 3 minutes, preferably from 30 to 90 seconds.

In this way, according to the negative pattern forming method using the chemical amplification resist composition of the present invention, the resist film in the unexposed area is dissolved and the exposed area where the polymer compound is crosslinked is hardly dissolved by the developer, as a result, a target pattern is formed on the substrate.

The present invention also relates to a photomask obtained by exposing and developing the resist-coated mask blank. As for the exposure and development, the above-described steps are applied. This photomask is suitably used for the manufacture of a semiconductor.

EXAMPLES

The present invention is described in greater detail below by referring to Examples, but the contents of the present invention should not be construed as being limited thereto.

(I) Example as Chemical Amplification Negative Resist (Electron Beam, Alkali Development)

1. Synthesis Example of Polymer Compound (A) (Component (A))

Synthesis Example 1

Synthesis of Polymer Compound (A1)

In 120 mL of tetrahydrofuran (THF), 20 g of poly(p-hydroxystyrene) (VP2500) produced by Nippon Soda Co., Ltd. was dissolved, and 4.96 g of 1-adamantanecarbonyl chloride and 3.37 g of triethylamine were added thereto. The mixture was stirred at 50° C. for 4 hours, and the reaction solution was returned to room temperature. Thereafter, 100 mL of ethyl acetate and 100 mL of distilled water were added thereto, and an aqueous 1 N HCl solution was added little by little to the reaction solution to effect neutralization while stirring the reaction solution in ice water. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated and added dropwise in 2 L of hexane. After filtration, the powder was collected and vacuum-dried to obtain 20.6 g of Polymer Compound (A1).

Other polymer compounds were synthesized in the same manner as Polymer Compound (A1).

With respect to the polymer compounds obtained, the compositional ratio (molar ratio) of the polymer compound was calculated by $^1$H-NMR measurement. Also, the weight average molecular weight (Mw, in terms of polystyrene), number average molecular weight (Mn, in terms of polystyrene) and polydispersity (Mw/Mn) of the polymer compound were calculated by GPC (solvent: THF, column: TSK gel Multipore HXL-M produced by Tosoh Corporation, column temperature: 40° C., flow velocity: 1.0 mL/min, detector: RI) measurement.

The glass transition temperature (Tg) was determined from an inflection point when a differential scanning calorimeter (DSC), Q2000, manufactured by TA Instruments was used and after weighing about 2 mg of a vacuum-dried polymer sample in an aluminum pan and setting the aluminum pan on the DSC measurement holder, the temperature was raised at 2° C./min from 10° C. to 300° C.

In the Tables below, the weight average molecular weight, the polydispersity and Tg are shown together with the chemical formula and compositional ratio of the polymer compound.

TABLE 1

| Polymer Compound | Chemical Formula | Compositional Ratio (molar ratio) | Weight Average Molecular Weight | Polydispersity | Tg (° C.) |
|---|---|---|---|---|---|
| Polymer Compound (A1) | 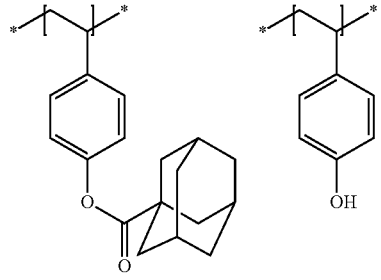 | 10/90 | 3500 | 1.13 | 162 |
| Polymer Compound (A2) | 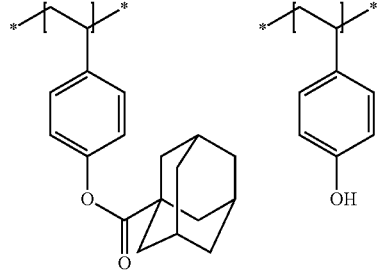 | 15/85 | 3600 | 1.13 | 164 |
| Polymer Compound (A3) | 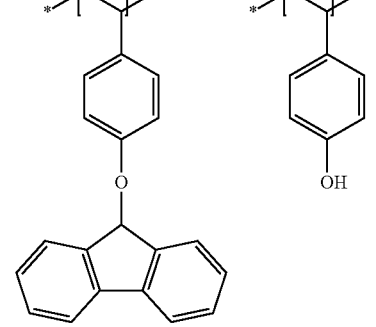 | 10/90 | 3500 | 1.13 | 149 |

TABLE 1-continued
| Polymer Compound (A4) | 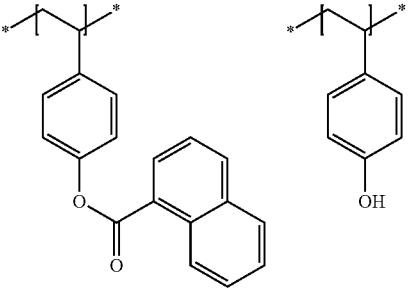 | 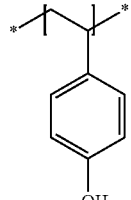 | 15/85 | 3400 | 1.13 | 151 |
|---|---|---|---|---|---|---|
| Polymer Compound (A5) | 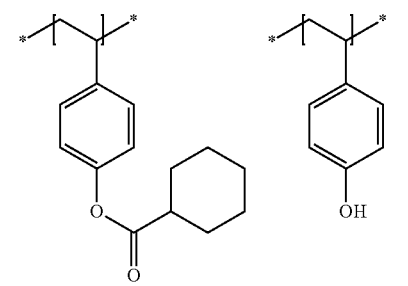 | 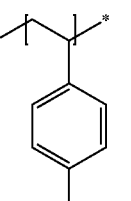 | 10/90 | 3500 | 1.13 | 145 |
| Polymer Compound (A6) | 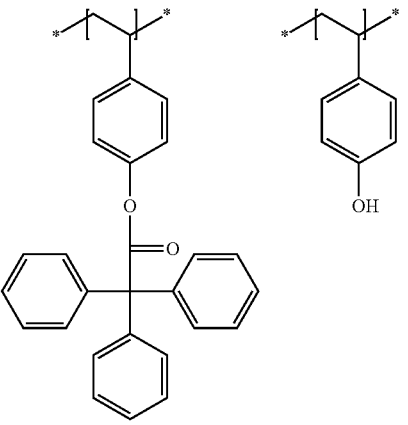 | 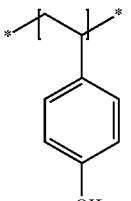 | 18/82 | 3700 | 1.13 | 149 |
| Polymer Compound (A7) | 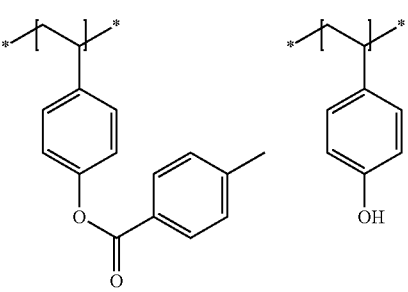 | 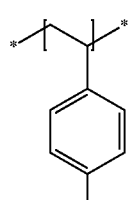 | 15/85 | 3500 | 1.13 | 151 |
| Polymer Compound (A8) | 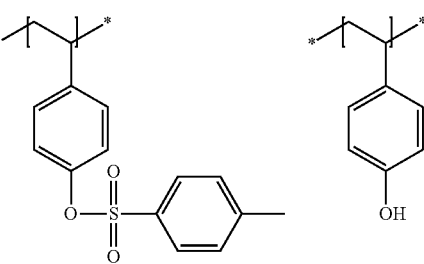 | 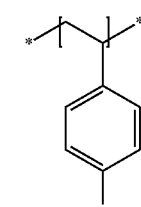 | 10/90 | 3500 | 1.13 | 144 |

TABLE 1-continued

| Polymer Compound/Compound | Chemical Formula | | Compositional Ratio (molar ratio) | Weight Average Molecular Weight | Polydispersity | Tg (° C.) |
|---|---|---|---|---|---|---|
| Polymer Compound (A9) | (styrene with p-O-C(=O)-cyclohexyl substituent) | (p-hydroxystyrene) | 10/90 | 5000 | 1.10 | 150 |
| Polymer Compound (A10) | (styrene with p-O-C(=O)-CH2-cyclohexyl substituent) | (p-hydroxystyrene) | 15/85 | 6400 | 1.07 | 155 |
| Polymer Compound (A11) | (styrene with p-O-C(=O)-adamantyl substituent) | (p-hydroxystyrene) | 15/85 | 2100 | 1.19 | 150 |

| Polymer Compound/Compound | Chemical Formula | Compositional Ratio (molar ratio) | Weight Average Molecular Weight | Polydispersity | Tg (° C.) |
|---|---|---|---|---|---|
| Comparative Polymer Compound (A1) | (p-hydroxystyrene) | 100 | 3200 | 1.13 | 154 |
| Comparative Polymer Compound (A2) | (p-hydroxystyrene / p-benzyloxystyrene) | 90/10 | 10000 | 1.13 | 165 |

TABLE 1-continued

| Compound | Structure | Ratio | Mw | PDI | Value |
|---|---|---|---|---|---|
| Comparative Polymer Compound (A3) | copolymer of 4-hydroxystyrene and 4-(benzyloxy)styrene | 80/20 | 3500 | 1.13 | 130 |
| Comparative Polymer Compound (A4) | oligomer with HO–/–OCH₃ substituted aromatic units (n=4) linked via CH(2,4-dimethylphenyl) bridges | — | 961.2 (weight molecular weight) | 1.00 | 200 or more |
| Comparative Polymer Compound (A5) | copolymer of 4-hydroxystyrene and 4-acetoxystyrene | 85/15 | 3200 | 1.13 | 131 |
| Comparative Polymer Compound (A6) | copolymer of 4-(cyclohexanecarbonyloxy)styrene and 4-hydroxystyrene | 15/85 | 6000 | 1.37 | 155 |
| Comparative Polymer Compound (A7) | copolymer of 4-(cyclohexanecarbonyloxy)styrene and 4-hydroxystyrene | 15/85 | 7000 | 1.13 | 160 |
| Comparative Polymer Compound (A8) | copolymer of 4-(cyclohexanecarbonyloxy)styrene and 4-hydroxystyrene | 15/85 | 1800 | 1.18 | 110 |

TABLE 1-continued

| Comparative Polymer Compound (A9) | | 15/85 | 3000 | 1.22 | 120 |

2. Example

Example 1E

(1) Preparation of Support

A Cr oxide-deposited 6-inch wafer (a wafer subjected to a treatment of forming a shielding film, which is used for normal photomask blank) was prepared.

(2) Preparation of Resist Coating Solution

| (Coating Solution Formulation of Negative Resist Composition N1) | |
|---|---|
| Polymer Compound (A1) | 0.60 g |
| Photoacid generator (z42) (the structural formula is shown above) | 0.12 g |
| Crosslinking Agent CL-1 (the structural formula is shown below) | 0.08 g |
| Crosslinking Agent CL-4 (the structural formula is shown below) | 0.04 g |
| Tetrabutylammonium hydroxide (basic compound) | 0.002 g |
| 2-Hydroxy-3-naphthoic acid (organic carboxylic acid) | 0.012 g |
| Surfactant PF6320 (produced by OMNOVA) | 0.001 g |
| Propylene glycol monomethyl ether acetate (solvent) | 4.0 g |
| Propylene glycol monomethyl ether (solvent) | 5.0 g |

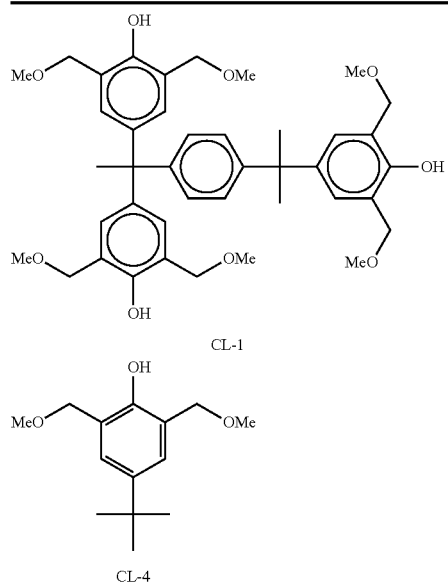

The solution of the formulation above was microfiltered through a membrane filter having a pore size of 0.04 μm to obtain a resist coating solution.

(3) Preparation of Resist Film

The resist coating solution was coated on the 6-inch wafer above by using a spin coater, Mark 8, manufactured by Tokyo Electron Ltd. and dried on a hot plate at 110° C. for 90 seconds to obtain a resist film having a thickness of 100 nm. That is, a resist-coated mask blank was obtained.

(4) Production of Negative Resist Pattern

This resist film was patternwise irradiated by using an electron beam lithography device (ELS-7500 manufactured by ELIONIX INC., accelerating voltage: 50 KeV). After the irradiation, the resist film was heated on a hot plate at 120° C. for 90 seconds, dipped in an aqueous 2.38 mass % tetramethylammonium hydroxide (TMAH) solution for 60 seconds, rinsed with water for 30 seconds and dried.

(5) Evaluation of Resist Pattern

The obtained pattern was evaluated for the sensitivity, resolution, pattern profile, line edge roughness (LER) and dry etching resistance by the following methods.
[Sensitivity]
The cross-sectional profile of the pattern obtained was observed using a scanning electron microscope (S-4300, manufactured by Hitachi, Ltd.), and the exposure dose (dose of electron beam irradiation) when resolving a resist pattern with a line width of 100 nm (line:space=1:1) was taken as the sensitivity. A smaller value indicates higher sensitivity.
[Resolution]
The limiting resolution (the minimum line width below which the line and the space (line:space=1:1) were not separated and resolved) at the exposure dose (dose of electron beam irradiation) giving the sensitivity above was taken as the resolution (nm).
[Pattern Profile]
The cross-sectional profile of the line pattern with a line width of 100 nm (L/S=1/1) at the exposure dose (dose of electron beam irradiation) giving the sensitivity above was observed by a scanning electron microscope (S-4300, manufactured by Hitachi, Ltd.). The cross-sectional profile of the line pattern was rated "reverse taper" when the ratio represented by [line width in the top part (surface part) of line pattern/line width in the middle of line pattern (the position of half the height of line pattern)] is 1.5 or more, rated "slightly reverse taper" when the ratio above is from 1.2 to less than 1.5, and rated "rectangle" when the ratio is less than 1.2.
[Line Edge Roughness (LER)]
A line pattern (L/S=1/1) having a line width of 100 nm was formed with the irradiation dose (dose of electron beam irradiation) giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of the measured distances was determined, and 3σ was computed. A smaller value indicates better performance.

[Dry Etching Resistance]

A resist film where a resist pattern having a line width of 100 nm (line:space=1:1) was formed with the irradiation dose (dose of electron beam irradiation) giving the sensitivity above was subjected to dry etching for 30 seconds by using an Ar/$C_4F_6$/$O_2$ gas (a mixed gas in a volume ratio of 100/4/2) in HITACHI U-621. Thereafter, the residual resist film ratio was measured and used as an indicator of dry etching resistance.

Very good: A residual film ratio of 95% or more.
Good: From 90% to less than 95%.
Bad: Less than 90%.

[Example 2E] to [Example 18E], [Comparative Example 1E] and [Comparative Example 9E]

Preparation of the resist solutions (Negative Resist Compositions N2 to N18 and Comparative Negative Resist Compositions N1 and N9), negative pattern formation and evaluations thereof were performed in the same manner as in Example 1E except that in the resist solution formulation, the components in Table 2 below were used.

TABLE 2

| Composition | Resin/Compound | Acid Generator | Basic Compound | Crosslinking Agent | Solvent |
|---|---|---|---|---|---|
| N1 | Polymer compound (A1) (0.6 g) | z42 (0.12 g) | B1 (0.002 g) | CL-1/CL-4 (0.08 g/0.04 g) | S2/S1 (5.0 g/4.0 g) |
| N2 | Polymer compound (A2) (0.6 g) | z42 (0.12 g) | B1 (0.002 g) | CL-1/CL-4 (0.08 g/0.04 g) | S1/S3 (5.0 g/4.0 g) |
| N3 | Polymer compound (A3) (0.6 g) | z42 (0.12 g) | B1 (0.002 g) | CL-1/CL-4 (0.08 g/0.04 g) | S2/S3 (5.0 g/4.0 g) |
| N4 | Polymer compound (A4) (0.6 g) | z42 (0.12 g) | B1 (0.002 g) | CL-1/CL-4 (0.08 g/0.04 g) | S2/S7 (5.0 g/4.0 g) |
| N5 | Polymer compound (A5) (0.6 g) | z42 (0.12 g) | B1 (0.002 g) | CL-1/CL-4 (0.08 g/0.04 g) | S2/S1 (5.0 g/4.0 g) |
| N6 | Polymer compound (A1) (0.6 g) | z67 (0.12 g) | B2 (0.002 g) | CL-1/CL-4 (0.08 g/0.04 g) | S2/S1 (5.0 g/4.0 g) |
| N7 | Polymer compound (A4) (0.6 g) | z37 (0.12 g) | B4 (0.002 g) | CL-4/CL-1 (0.08 g/0.04 g) | S1/S2/S6 (4.0 g/4.0 g/1.0 g) |
| N8 | Polymer compound (A1) (0.6 g) | z42 (0.12 g) | B5 (0.002 g) | CL-3 (0.12 g) | S1/S2/S5 (4.0 g/4.0 g/1.0 g) |
| N9 | Polymer compound (A4) (0.6 g) | z48/z66 (0.06 g/0.06 g) | B6 (0.002 g) | CL-2/CL-3 (0.18 g/0.04 g) | S1/S2/S4 (4.0 g/4.0 g/1.0 g) |
| N10 | Polymer compound (A1) (0.6 g) | z49 (0.12 g) | B1 (0.002 g) | CL-4/CL-1 (0.18 g/0.04 g) | S2/S1 (5.0 g/4.0 g) |
| N11 | Polymer compound (A1)/Polymer compound (A2) (0.3 g/0.3 g) | z61 (0.12 g) | B1/B6 (0.001 g/0.001 g) | CL-1/CL-4 (0.08 g/0.04 g) | S2/S1 (5.0 g/4.0 g) |
| N12 | Polymer compound (A4) (0.6 g) | z2 (0.12 g) | B1 (0.002 g) | CL-1/CL-4 (0.08 g/0.04 g) | S2/S1 (5.0 g/4.0 g) |
| N13 | Polymer compound (A6) (0.6 g) | z5 (0.12 g) | B1 (0.002 g) | CL-1/CL-4 (0.08 g/0.04 g) | S2/S1 (5.0 g/4.0 g) |
| N14 | Polymer compound (A7) (0.6 g) | z63 (0.12 g) | B1 (0.002 g) | CL-1/CL-4 (0.08 g/0.04 g) | S2/S1 (5.0 g/4.0 g) |
| N15 | Polymer compound (A8) (0.6 g) | z65 (0.12 g) | B1 (0.002 g) | CL-1/CL-4 (0.08 g/0.04 g) | S2/S1 (5.0 g/4.0 g) |
| N16 | Polymer compound (A9) (0.6 g) | z8 (0.12 g) | B1 (0.002 g) | CL-1/CL-4 (0.08 g/0.04 g) | S2/S1 (5.0 g/4.0 g) |
| N17 | Polymer compound (A10) (0.6 g) | z42 (0.12 g) | B1 (0.002 g) | CL-1/CL-4 (0.08 g/0.04 g) | S2/S1 (5.0 g/4.0 g) |
| N18 | Polymer compound (A11) (0.6 g) | z68 (0.12 g) | B1 (0.002 g) | CL-1/CL-4 (0.08 g/0.04 g) | S2/S1 (5.0 g/4.0 g) |
| Comparative Composition N1 | Comparative polymer compound (A1) (0.6 g) | z2 (0.12 g) | B2 (0.002 g) | CL-3 (0.12 g) | S2/S1 (5.0 g/4.0 g) |
| Comparative Composition N2 | Comparative polymer compound (A2) (0.6 g) | z2 (0.12 g) | B2 (0.002 g) | CL-3 (0.12 g) | S2/S1 (5.0 g/4.0 g) |
| Comparative Composition N3 | Comparative polymer compound (A3) (0.6 g) | z2 (0.12 g) | B2 (0.002 g) | CL-3 (0.12 g) | S2/S1 (5.0 g/4.0 g) |
| Comparative Composition N4 | Comparative Compound (A4) (0.6 g) | z2 (0.12 g) | B2 (0.002 g) | CL-3 (0.12 g) | S2/S1 (5.0 g/4.0 g) |
| Comparative Composition N5 | Comparative polymer compound (A5) (0.6 g) | z2 (0.12 g) | B2 (0.002 g) | CL-3 (0.12 g) | S2/S1 (5.0 g/4.0 g) |
| Comparative Composition N6 | Comparative polymer compound (A6) (0.6 g) | z2 (0.12 g) | B2 (0.002 g) | CL-3 (0.12 g) | S2/S1 (5.0 g/4.0 g) |
| Comparative Composition N7 | Comparative polymer compound (A7) (0.6 g) | z2 (0.12 g) | B2 (0.002 g) | CL-3 (0.12 g) | S2/S1 (5.0 g/4.0 g) |
| Comparative Composition N8 | Comparative polymer compound (A8) (0.6 g) | z2 (0.12 g) | B2 (0.002 g) | CL-3 (0.12 g) | S2/S1 (5.0 g/4.0 g) |
| Comparative Composition N9 | Comparative polymer compound (A9) (0.6 g) | z2 (0.12 g) | B2 (0.002 g) | CL-3 (0.12 g) | S2/S1 (5.0 g/4.0 g) |

Abbreviations used in the above and following Examples/Comparative Examples are described below.
[Acid Generator (Compound (B))]
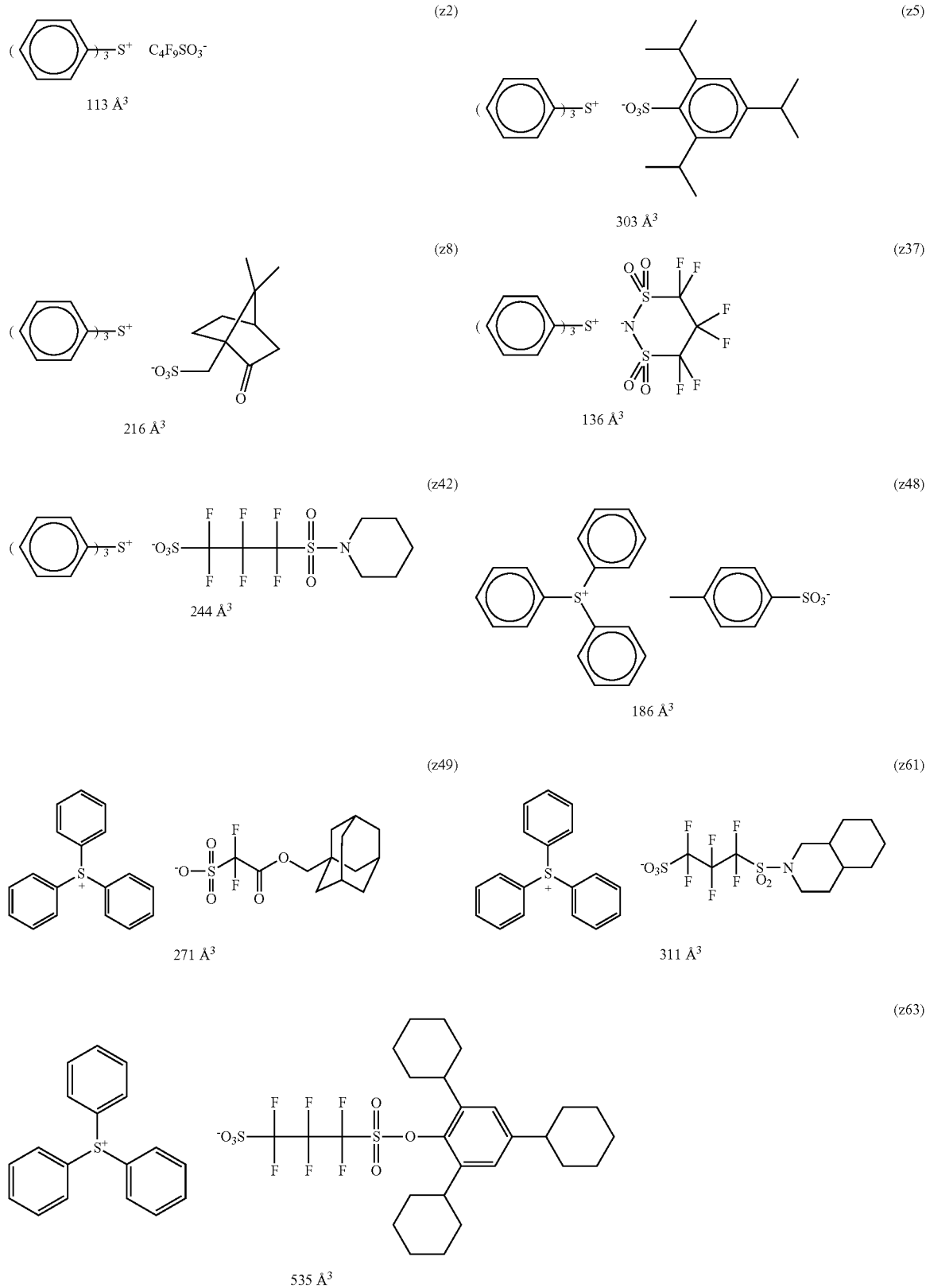

-continued
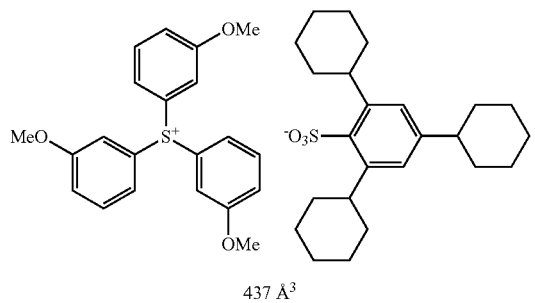 (z65)
437 Å³
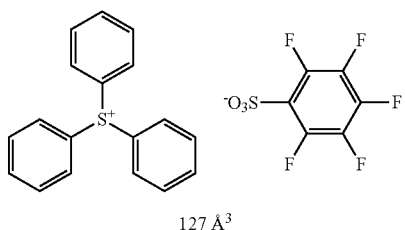 (z66)
127 Å³
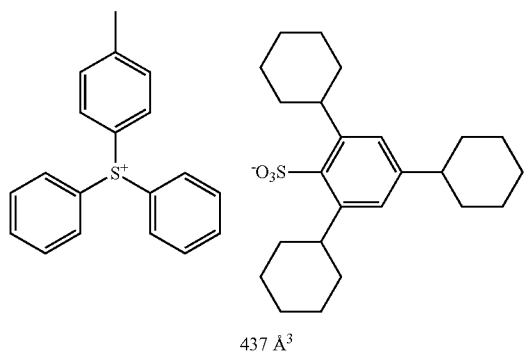 (z67)
437 Å³
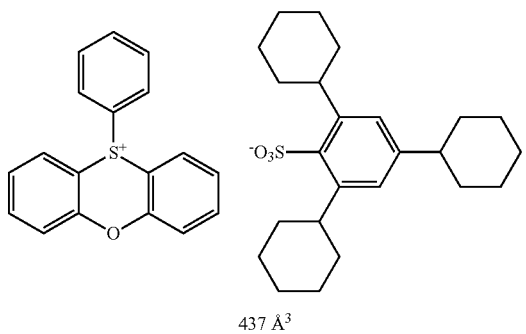 (z68)
437 Å³
[Crosslinking Agent (Compound (C))]
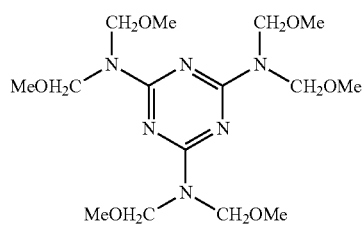 CL-2
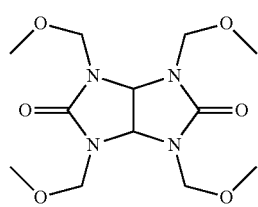 CL-3
[Basic Compound]
B1: Tetrabutylammonium hydroxide
B2: Tri(n-octyl)amine
B4:
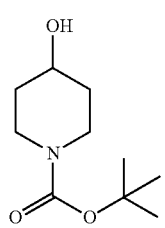
B5:
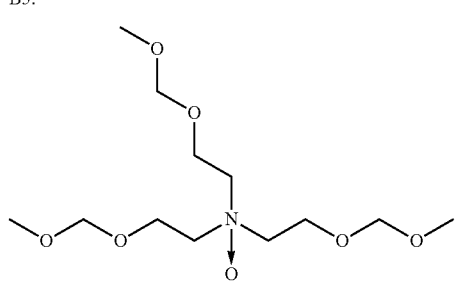

B6:

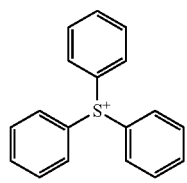

S1: Propylene glycol monomethyl ether acetate (1-methoxy-2-acetoxypropane)
S2: Propylene glycol monomethyl ether (1-methoxy-2-propanol)
S3: 2-Heptanone
S4: Ethyl lactate
S5: Cyclohexanone
S6: γ-Butyrolactone
S7: Propylene carbonate The evaluation results are shown in Table 3.

TABLE 3

(Electron Beam Exposure; Negative; Alkali Development)

| Example | Composition | Sensitivity ($\mu C/cm^2$) | Resolution (nm) | Pattern Profile | LER (nm) | Dry Etching Resistance |
|---|---|---|---|---|---|---|
| 1E | N1 | 10.2 | 40 | rectangle | 4.5 | very good |
| 2E | N2 | 10.0 | 40 | rectangle | 4.5 | very good |
| 3E | N3 | 10.2 | 45 | rectangle | 4.5 | good |
| 4E | N4 | 10.2 | 45 | rectangle | 4.5 | good |
| 5E | N5 | 10.2 | 45 | rectangle | 4.5 | good |
| 6E | N6 | 10.2 | 40 | slightly reverse taper | 4.5 | very good |
| 7E | N7 | 10.3 | 50 | slightly reverse taper | 5.0 | good |
| 8E | N8 | 11.2 | 40 | slightly reverse taper | 4.5 | very good |
| 9E | N9 | 11.3 | 50 | rectangle | 5.0 | good |
| 10E | N10 | 10.3 | 40 | rectangle | 4.5 | very good |
| 11E | N11 | 10.3 | 40 | rectangle | 4.5 | very good |
| 12E | N12 | 10.2 | 50 | rectangle | 5.0 | good |
| 13E | N13 | 10.1 | 45 | rectangle | 4.5 | good |
| 14E | N14 | 10.2 | 48 | rectangle | 4.5 | good |
| 15E | N15 | 10.3 | 45 | rectangle | 5.0 | good |
| 16E | N16 | 10.2 | 45 | rectangle | 5.0 | good |
| 17E | N17 | 10.1 | 48 | rectangle | 4.5 | good |
| 18E | N18 | 10.5 | 45 | rectangle | 4.5 | good |
| Comparative Example 1E | Comparative Composition N1 | 11.8 | 55 | reverse taper | 5.5 | good |
| Comparative Example 2E | Comparative Composition N2 | 10.6 | 65 | slightly reverse taper | 6.0 | good |
| Comparative Example 3E | Comparative Composition N3 | 10.5 | 55 | slightly reverse taper | 5.5 | bad |
| Comparative Example 4E | Comparative Composition N4 | 11.6 | 45 | reverse taper | 5.5 | bad |
| Comparative Example 5E | Comparative Composition N5 | 10.7 | 45 | slightly reverse taper | 5.5 | bad |
| Comparative Example 6E | Comparative Composition N6 | 13.8 | 55 | slightly reverse taper | 5.5 | good |
| Comparative Example 7E | Comparative Composition N7 | 11.8 | 60 | slightly reverse taper | 5.5 | good |
| Comparative Example 8E | Comparative Composition N8 | 10.8 | 45 | slightly reverse taper | 5.5 | bad |
| Comparative Example 9E | Comparative Composition N9 | 13.3 | 45 | slightly reverse taper | 5.5 | bad |

It is seen from the results shown in Table 3 that the composition according to the present invention is excellent in the sensitivity, resolution, pattern profile, line edge roughness (LER) and dry etching resistance.

(II) Example as Chemical Amplification Negative Resist (EUV, Alkali Development)

Examples 1F to 6F and Comparative Examples 1F and 2F

Preparation of Resist Solution

The negative resist composition shown in Table 4 below was filtered through a polytetrafluoroethylene filter having a pore size of 0.04 μm to prepare a negative resist solution.

(Evaluation of Resist)

The negative resist solution prepared was uniformly coated on a hexamethyldisilazane-treated silicon substrate by using a spin coater and dried by heating on a hot plate at 100° C. for 60 seconds to form a resist film having a thickness of 0.05 μm.

The obtained resist film was evaluated for the sensitivity, resolution, pattern profile, line edge roughness (LER) and dry etching resistance by the following methods.

[Sensitivity]

The obtained resist film was exposed to EUV light (wavelength: 13 nm) through a reflective mask having a 1:1 line-and-space pattern with a line width of 100 nm by changing the exposure dose in steps of 0.1 mJ/cm² in the range of 0 to 20.0 mJ/cm², then baked at 110° C. for 90 seconds and developed with an aqueous 2.38 mass % tetramethylammonium hydroxide (TMAH) solution.

The exposure dose when reproducing a line-and-space (L/S=1/1) mask pattern with a line width of 100 nm was taken as the sensitivity. A smaller value indicates higher sensitivity.

[Resolution (LS)]

The limiting resolution (the minimum line width below which the line and the space (line:space=1:1) were not separated and resolved) at the exposure dose giving the sensitivity above was taken as the LS resolution (nm).

[Pattern Profile]

The cross-sectional profile of the line pattern (L/S=1/1) with a line width of 100 nm at the exposure dose giving the sensitivity above was observed by a scanning electron microscope (S-4300, manufactured by Hitachi, Ltd.). The cross-sectional profile of the line pattern was rated "reverse taper" when the ratio represented by [line width in the top part (surface part) of line pattern/line width in the middle of line pattern (the position of half the height of line pattern)] is 1.5 or more, rated "slightly reverse taper" when the ratio above is from 1.2 to less than 1.5, and rated "rectangle" when the ratio is less than 1.2.

[Line Edge Roughness (LER)]

A line pattern (L/S=1/1) having a line width of 100 nm was formed with the exposure dose giving the sensitivity above. At arbitrary 30 points included in the longitudinal 50 μm region of the pattern, the distance from the reference line where the edge should be present was measured using a scanning electron microscope (S-9220, manufactured by Hitachi, Ltd.). The standard deviation of the measured distances was determined, and 3 σ was computed. A smaller value indicates better performance.

[Dry Etching Resistance]

A resist film formed by performing entire surface irradiation with the irradiation dose giving the sensitivity above was subjected to dry etching for 15 seconds by using an Ar/C$_4$F$_6$/O$_2$ gas (a mixed gas in a volume ratio of 100/4/2) in HITACHI U-621. Thereafter, the residual resist film ratio was measured and used as an indicator of dry etching resistance.

Very good: A residual film ratio of 95% or more.
Good: From 90% to less than 95%.
Bad: Less than 90%.

The evaluation results are shown in Table 4.

It is seen from the results shown in Table 4 that the composition according to the present invention is excellent in the sensitivity, resolution, pattern profile, line edge roughness (LER) and dry etching resistance.

(III) Example as Chemical Amplification Negative Resist (Electron Beam Exposure, Development Using Organic Developer)

Examples 1G to 6G and Comparative Examples 1G and 2G)

Preparation of Resist Solution

The negative resist composition shown in Table 5 below was filtered through a membrane filter having a pore size of 0.04 μm to prepare a resist coating solution.

(Preparation of Resist Film)

The resist coating solution was coated on a Cr oxide-deposited 6-inch wafer (a wafer subjected to a treatment of forming a shielding film, which is used for normal photomask blank) by using Mark 8 manufactured by Tokyo Electron Ltd. and dried on a hot plate at 130° C. for 90 seconds to obtain a resist film having a thickness of 100 nm. That is, a resist-coated mask blank was obtained.

This resist film was patternwise irradiated by using an electron beam lithography device (ELS-7500 manufactured by ELIONIX INC., accelerating voltage: 50 KeV). After the irradiation, the resist film was heated on a hot plate at 120° C. for 90 seconds, spray-developed for 30 seconds with a solvent obtained by mixing butyl acetate (boiling point=126° C.) as good solvent and decane (boiling point=174° C.) as poor solvent at a mass ratio of 85/15, and then thoroughly dried by spinning the wafer by a spin coater for 3,000 revolutions in 30 seconds (Evaluation of Resist Pattern)

The obtained pattern was evaluated for the sensitivity, resolution, pattern profile, line edge roughness (LER) and dry etching resistance by the same methods as those for evaluations in (I) Example as Chemical Amplification Negative Resist (electron beam exposure, alkali development).

TABLE 4

(EUV Exposure; Negative; Alkali Development)

| Example | Composition | Sensitivity (mJ/cm²) | Resolution (nm) | Pattern Profile | LER (nm) | Dry Etching Resistance |
|---|---|---|---|---|---|---|
| 1F | N1 | 12.8 | 45 | rectangle | 4.5 | very good |
| 2F | N2 | 12.6 | 45 | rectangle | 4.5 | very good |
| 3F | N3 | 12.3 | 50 | rectangle | 4.5 | good |
| 4F | N5 | 12.5 | 50 | rectangle | 4.5 | good |
| 5F | N6 | 12.5 | 45 | slightly reverse taper | 4.5 | very good |
| 6F | N8 | 14.0 | 45 | slightly reverse taper | 4.5 | very good |
| Comparative Example 1F | Comparative Composition N1 | 14.8 | 55 | reverse taper | 5.5 | good |
| Comparative Example 2F | Comparative Composition N2 | 14.8 | 65 | slightly reverse taper | 6.0 | good |

The evaluation results are shown in Table 5.

TABLE 5

(Electron Beam Exposure; Negative; Development Using Organic Developer)

| Example | Composition | Sensitivity ($\mu C/cm^2$) | Resolution (nm) | Pattern Profile | LER (nm) | Dry Etching Resistance |
|---|---|---|---|---|---|---|
| 1G | N1 | 10.8 | 38 | rectangle | 4.0 | very good |
| 2G | N2 | 11.2 | 38 | rectangle | 4.0 | very good |
| 3G | N3 | 11.3 | 40 | rectangle | 4.0 | good |
| 4G | N5 | 11.1 | 40 | rectangle | 4.0 | good |
| 5G | N6 | 11.0 | 38 | slightly reverse taper | 4.0 | very good |
| 6G | N8 | 12.0 | 38 | slightly reverse taper | 4.0 | very good |
| Comparative Example 1G | Comparative Composition N1 | 13.8 | 50 | reverse taper | 5.0 | good |
| Comparative Example 2G | Comparative Composition N2 | 13.8 | 55 | slightly reverse taper | 5.5 | good |

It is seen from the results shown in Table 5 that the composition according to the present invention is excellent in the sensitivity, resolution, pattern profile, line edge roughness (LER) and dry etching resistance.

This application is based on Japanese patent application No. JP 2011-163680 filed on Jul. 26, 2011, the entire contents of which are hereby incorporated by reference, the same as if set forth at length.

What is claimed is:

1. A chemical amplification resist composition comprising:
(A) a polymer compound having a phenolic hydroxyl group and a group formed by substituting a substituent for a hydrogen atom of a hydroxyl group in a phenolic hydroxyl group and satisfying the following (a) to (c) at the same time:
(a) the polydispersity is 1.2 or less,
(b) the weight average molecular weight is from 2,000 to 6,500, and
(c) the glass transition temperature (Tg) is 140° C. or more;
(B) a compound capable of generating an acid upon irradiation with an actinic ray or radiation, and
(C) a compound capable of crosslinking the polymer compound (A) by the action of an acid, wherein the polymer compound (A) contains a repeating unit represented by the following formula (II) in an amount of 10 to 90 mol% based on all repeating units in the polymer compound (A):

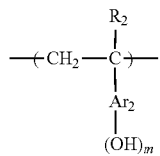

(II)

Wherein $R_2$ represents a hydrogen atom, a methyl group which may have a substituent, or a halogen atom, $Ar_2$ represents an aromatic ring group, and m represents an integer of 1 or more.

2. The chemical amplification resist composition according to claim 1, wherein the compound (C) is a compound having two or more hydroxymethyl groups or alkoxymethyl groups within the molecule.

3. The chemical amplification resist composition according to claim 1, wherein the polydispersity of the polymer compound (A) is 1.05 to 1.18.

4. The chemical amplification resist composition according to claim 1, wherein the weight average molecular weight of the polymer compound (A) is from 2,500 to 5,000.

5. The chemical amplification resist composition according to claim 1, wherein the substituent in the group formed by substituting a substituent for a hydrogen atom of a hydroxyl group in a phenolic hydroxyl group of the polymer compound (A) is a group having a cyclic hydrocarbon structure.

6. The chemical amplification resist composition according to claim 5, wherein the group having a cyclic hydrocarbon structure is a group having a polycyclic hydrocarbon structure.

7. The chemical amplification resist composition according to claim 1, wherein the polymer compound (A) contains a repeating unit represented by formula (I):

(I)

wherein in formula (I), $R_1$ represents a hydrogen atom or a methyl group, $Ar_1$ represents an aromatic ring group, and Y represents a group having a cyclic hydrocarbon structure.

8. A resist film formed from the chemical amplification resist composition according to claim 1.

9. The resist film according to claim 8, having a thickness of 10 to 150 nm.

10. A resist-coated mask blank coated with the resist film according to claim 8.

11. A resist pattern forming method comprising:
exposing the resist-coated mask blank according to claim 10, and
developing the exposed mask blank.

12. The resist pattern forming method according to claim 11, wherein the exposing is performed using an electron beam or an extreme-ultraviolet ray.

13. A photomask obtained by exposing and developing the resist-coated mask blank according to claim 10.

14. A resist pattern forming method comprising:
exposing the resist film according to claim 8 and,
developing the exposed film.

15. The resist pattern forming method according to claim 14, wherein the exposing is performed using an electron beam or an extreme-ultraviolet ray.

* * * * *